US008463199B2

(12) United States Patent
Sugar et al.

(10) Patent No.: US 8,463,199 B2
(45) Date of Patent: Jun. 11, 2013

(54) MULTIPLE-INPUT MULTIPLE-OUTPUT RADIO TRANSCEIVER

(75) Inventors: Gary L. Sugar, Rockville, MD (US); Robert M. Masucci, Potomac, MD (US); David G. Rahn, Kanata (CA)

(73) Assignee: IPR Licensing, Inc., Wilmington, DE (US)

( * ) Notice: Subject to any disclaimer, the term of this patent is extended or adjusted under 35 U.S.C. 154(b) by 681 days.

(21) Appl. No.: 12/641,824

(22) Filed: Dec. 18, 2009

(65) Prior Publication Data
US 2010/0099366 A1 Apr. 22, 2010

Related U.S. Application Data

(63) Continuation of application No. 10/707,744, filed on Jan. 8, 2004, now Pat. No. 7,636,554, which is a continuation of application No. 10/065,388, filed on Oct. 11, 2002, now Pat. No. 6,728,517.

(60) Provisional application No. 60/319,434, filed on Jul. 30, 2002, provisional application No. 60/319,360, filed on Jul. 27, 2002, provisional application No. 60/319,336, filed on Jun. 21, 2002, provisional application No. 60/376,722, filed on Apr. 29, 2002, provisional application No. 60/374,531, filed on Apr. 22, 2002.

(51) Int. Cl.
*H04B 1/38* (2006.01)
*H04B 1/28* (2006.01)
*H04M 1/00* (2006.01)

(52) U.S. Cl.
USPC ........... 455/73; 455/272; 455/333; 455/552.1

(58) Field of Classification Search
USPC .................. 455/73, 76, 78, 83, 86, 101, 132, 455/133, 137, 266, 269, 272, 273, 324, 333, 455/340, 552.1, 553.1; 370/276, 277, 278; 375/219
See application file for complete search history.

(56) References Cited

U.S. PATENT DOCUMENTS

| 4,150,344 A | 4/1979 | Fenk |
|---|---|---|
| 4,263,676 A | 4/1981 | Liebel |

(Continued)

FOREIGN PATENT DOCUMENTS

| DE | 196 09 811 | 8/1996 |
|---|---|---|
| EP | 0 176 069 | 4/1986 |

(Continued)

OTHER PUBLICATIONS

"Fodus Delivers 802.11B/G and 802.11B/A/G WLAN Total Solutions", http://www.fodus.com/DOCS/2003-09-15%20Fodus%20Press%20Release.htm, Sep. 15, 2003.

(Continued)

*Primary Examiner* — Quochien B Vuong
(74) *Attorney, Agent, or Firm* — Volpe and Koenig, P.C.

(57) ABSTRACT

A MIMO radio transceiver to support processing of multiple signals for simultaneous transmission via corresponding ones of a plurality of antennas and to support receive processing of multiple signals detected by corresponding ones of the plurality of antennas. The radio transceiver provides, on a single semiconductor integrated circuit, a receiver circuit or path for each of a plurality of antennas and a transmit circuit or path for each of the plurality of antennas. Each receiver circuit downconverts the RF signal detected by its associated antenna to a baseband signal. Similarly, each transmit path upconverts a baseband signal to be transmitted by an assigned antenna.

42 Claims, 11 Drawing Sheets

U.S. PATENT DOCUMENTS

| | | |
|---|---|---|
| 4,310,809 A | 1/1982 | Buck et al. |
| 4,580,289 A | 4/1986 | Enderby |
| 4,696,055 A | 9/1987 | Marshall |
| 4,905,306 A | 2/1990 | Anderson |
| 5,054,114 A | 10/1991 | Erickson |
| 5,150,085 A | 9/1992 | Hales |
| 5,220,679 A | 6/1993 | Zametzger et al. |
| 5,220,688 A | 6/1993 | Tao |
| 5,222,253 A | 6/1993 | Heck |
| 5,297,203 A * | 3/1994 | Rose et al. .................. 380/270 |
| 5,406,615 A * | 4/1995 | Miller et al. .............. 455/552.1 |
| 5,444,864 A | 8/1995 | Smith |
| 5,526,527 A * | 6/1996 | Lipowski et al. .......... 455/183.1 |
| 5,548,825 A | 8/1996 | Maemura et al. |
| 5,579,341 A | 11/1996 | Smith et al. |
| 5,606,736 A | 2/1997 | Hasler et al. |
| 5,715,529 A | 2/1998 | Kianush et al. |
| 5,722,040 A * | 2/1998 | Bjerede et al. ................. 455/76 |
| 5,752,169 A | 5/1998 | Hareyama et al. |
| 5,758,265 A | 5/1998 | Okanobu |
| 5,802,463 A * | 9/1998 | Zuckerman .................. 455/208 |
| 5,818,883 A | 10/1998 | Smith et al. |
| 5,832,375 A | 11/1998 | Leisten et al. |
| 5,859,854 A | 1/1999 | Reudink |
| 5,878,332 A | 3/1999 | Wang et al. |
| 5,881,372 A * | 3/1999 | Kruys .......................... 455/113 |
| 5,960,330 A * | 9/1999 | Azuma .......................... 455/70 |
| 5,966,666 A | 10/1999 | Yamaguchi et al. |
| 5,974,306 A | 10/1999 | Hornak et al. |
| 6,009,130 A * | 12/1999 | Lurey et al. ................... 375/347 |
| 6,018,644 A * | 1/2000 | Minarik .......................... 455/82 |
| 6,094,084 A | 7/2000 | Abou-Allam et al. |
| 6,097,269 A | 8/2000 | Hernandez |
| 6,125,266 A | 9/2000 | Matero et al. |
| 6,151,354 A | 11/2000 | Abbey |
| 6,157,822 A | 12/2000 | Bastani et al. |
| 6,215,988 B1 | 4/2001 | Matero |
| 6,239,645 B1 | 5/2001 | Tsukahara et al. |
| 6,252,548 B1 | 6/2001 | Jeon |
| 6,259,895 B1 | 7/2001 | Yoshikawa et al. |
| 6,282,184 B1 | 8/2001 | Lehman et al. |
| 6,282,413 B1 | 8/2001 | Baltus |
| 6,285,720 B1 | 9/2001 | Martone |
| 6,351,502 B1 | 2/2002 | Zargari |
| 6,359,923 B1 | 3/2002 | Agee et al. |
| 6,377,631 B1 | 4/2002 | Raleigh |
| 6,380,910 B1 * | 4/2002 | Moustakas et al. ........... 343/893 |
| 6,381,471 B1 | 4/2002 | Dvorkin |
| 6,433,742 B1 * | 8/2002 | Crawford .............. 343/700 MS |
| 6,456,833 B1 | 9/2002 | Sessink |
| 6,473,467 B1 | 10/2002 | Wallace et al. |
| 6,477,148 B1 | 11/2002 | Gardenfors et al. |
| 6,529,719 B1 | 3/2003 | Imbornone et al. |
| 6,542,724 B1 | 4/2003 | Copeland et al. |
| 6,549,096 B2 | 4/2003 | Groves et al. |
| 6,553,216 B1 | 4/2003 | Pugel et al. |
| 6,609,010 B1 * | 8/2003 | Dolle et al. ................. 455/552.1 |
| 6,658,850 B1 * | 12/2003 | House et al. ..................... 60/646 |
| 6,687,492 B1 | 2/2004 | Sugar et al. |
| 6,766,149 B1 | 7/2004 | Hikita et al. |
| 6,771,706 B2 | 8/2004 | Ling et al. |
| 6,778,612 B1 | 8/2004 | Lozano et al. |
| 6,785,520 B2 | 8/2004 | Sugar et al. |
| 6,873,651 B2 | 3/2005 | Tesfai |
| 6,888,809 B1 | 5/2005 | Foschini et al. |
| 7,006,848 B2 | 2/2006 | Ling et al. |
| 7,031,755 B2 | 4/2006 | Li et al. |
| 2001/0011013 A1 | 8/2001 | Vorenkamp et al. |
| 2001/0015994 A1 | 8/2001 | Nam |
| 2001/0036818 A1 | 11/2001 | Dobrovolny |
| 2002/0077070 A1 | 6/2002 | McNamara et al. |
| 2002/0111142 A1 | 8/2002 | Klimovitch |
| 2002/0145681 A1 | 10/2002 | Sasaki |
| 2002/0150173 A1 | 10/2002 | Buda |
| 2002/0164963 A1 | 11/2002 | Tehrani et al. |
| 2002/0165626 A1 | 11/2002 | Hammons, Jr. et al. |
| 2002/0173337 A1 | 11/2002 | Hajimiri et al. |
| 2002/0177447 A1 | 11/2002 | Walton et al. |
| 2003/0002604 A1 | 1/2003 | Fifield et al. |
| 2003/0035491 A1 | 2/2003 | Walton et al. |
| 2003/0076797 A1 | 4/2003 | Lozano |
| 2003/0076908 A1 | 4/2003 | Huang et al. |
| 2003/0185285 A1 | 10/2003 | Talwar |
| 2003/0207668 A1 | 11/2003 | McFarland et al. |
| 2003/0223391 A1 | 12/2003 | Malaender et al. |
| 2003/0224750 A1 | 12/2003 | Sampath |
| 2004/0017847 A1 | 1/2004 | Alberth, Jr. et al. |
| 2004/0204036 A1 | 10/2004 | Yang |
| 2004/0234012 A1 | 11/2004 | Rooyen |
| 2004/0252632 A1 | 12/2004 | Bourdoux et al. |
| 2005/0009476 A1 | 1/2005 | Wu et al. |
| 2005/0020298 A1 | 1/2005 | Masumoto et al. |
| 2005/0042997 A1 | 2/2005 | Steele et al. |
| 2005/0047384 A1 | 3/2005 | Wax et al. |
| 2005/0123025 A1 | 6/2005 | Sorrells et al. |

FOREIGN PATENT DOCUMENTS

| | | |
|---|---|---|
| EP | 0 823 790 | 2/1998 |
| EP | 1 128 546 | 2/2000 |
| EP | 1 160 992 | 12/2001 |
| EP | 1 207 645 | 5/2002 |
| EP | 1 387 501 | 2/2004 |
| EP | 1 569 362 | 8/2005 |
| GB | 2 008 881 | 11/1978 |
| GB | 2 200 003 | 12/1987 |
| GB | 2 279 527 | 1/1994 |
| GB | 2 339 079 | 1/2000 |
| GB | 2 349 309 | 10/2000 |
| JP | H11-46113 | 2/1999 |
| JP | 2000-188522 | 7/2000 |
| JP | 2001-024569 | 1/2001 |
| JP | 2001-285114 | 10/2001 |
| JP | 2002-26462 | 1/2002 |
| JP | 2003-060604 | 2/2003 |
| JP | 2003-244045 | 8/2003 |
| JP | 2003-283359 | 10/2003 |
| JP | 2004-179822 | 6/2004 |
| JP | 2004-336561 | 11/2004 |
| KR | 2003-0058265 | 7/2003 |
| KR | 2005-0013011 | 2/2005 |
| WO | 03/092997 | 11/2003 |

OTHER PUBLICATIONS

"Parkervision Announces Successful Development of Most Integrated High Performance Wireless LAN Transceiver Chips Current Available", Jul. 30, 2002.

"Single Chip Bluetooth Radio Transceiver", STMicroelectronics, 2001, (2 pages).

Bouras et al. "A Digitally Calibrated 5.15-5.825GHz Transceiver for 802.11a Wireless LANs in 0.18μm CMOS." 2003 IEEE International Solid-State Circuits Conference.

Brodersen, "BWRC Status", Summer 2002 Retreat Presentations, Berkeley Wireless Research Center, Jun. 3, 2002.

Brodersen et al. "Wireless Systems-On-a-Chip Design." IEEE, 2001, pp. 45-48.

Cabric et al. "On MIMO Signal Processing for Adaptive W-CDMA and OFDM Wireless Transceivers." IEEE 2005.

Cabric et al., "RF Front-End for MCMA Systems", Summer 2002 Retreat Presentations, Berkeley Wireless Research Center, Jun. 3, 2002.

Cho et al., "Multi-Standard Monolithic CMOS RF Transceiver", University of California, Berkeley, Jan. 8, 1996, (1-26).

Clarke, "Chip Set Bridges 802.11a and .11b Wireless LANs", EETimes.com, http://www.eetimes.com/showArticle.jhtm?articleID=10809297, Sep. 24, 2001.

Copeland et al., "5GHz SiGe HBT Monolithic Radio Transceiver with Tunable Filtering", IEEE Trans. on Microwave Theory and Techniques, Feb. 2000, vol. 48, No. 2.

Ellingson et al., "An 8-Element Dual-Frequency Array Receiver for Propagation Measurements Near 2.4 GHz", The Ohio State University ElectroScience Laboratory, Jul. 2001.

Gozali et al., "Virginia Tech Space-Time Advanced Radio (VT-STAR)", Proceedings, Radio and Wirless Conference (RAWCON), 2001.

Lantz, "A 5GHz, SiGe, Monolithic WLAN Transceiver", PCC Workshop, 1999.

Long, "A Low Voltage 5.1-5.8 GHz Image-Reject Downconverter RF IC", IEEE Journal of Solid State Circuits, vol. 35, No. 9, Sep. 2000, pp. 1320-1328.

Macedo et al., "A 1.9-GHz Silicon Receiver with Monolithic Image Filtering", IEEE Journal of Solid-State Circuits, vol. 33, No. 3, Mar. 1998, pp. 378-386.

Madihian et al., "A 5 GHz-Band Multifunctional BiCMOS Transceiver Chip for GMSK Modulation Wireless Systems," IEEE Journal of Solid-State Circuits, vol. 34, No. 1, Jan. 1999.

Nikolic, "From Algorithms to Systems-on-a-Chip in a Semester", BWRC Winter 2001 Retreat, Berkeley Wireless Research Center, Jan. 8, 2001.

Poon et al. "Degrees of Freedom in Multiple-Antenna Channels: A Signal Space Approach." IEEE Transactions on Information Theory, vol. 51, No. 2, Feb. 2005, pp. 523-536.

Poon et al. "An Adaptive Multiantemma Transceiver for Slowly Flat Fading Channels." IEEE Transactions on Communications, vol. 51, No. 11, Nov. 2003, pp. 1820-1827.

Poon et al. "Indoor Multiple-Antenna Channel Characterization From 2 to 8 GHz." IEEE 2003, pp. 3519-3523.

Poon et al. "The Signal Dimensions in Multiple-Antenna Channels." IEEE 2003, pp. 1247-1251.

Poon et al. "Multiple-Antenna Channels From a Combined Physical and Networking Perspective." IEEE 2002, pp. 1528-1532.

Poon et al. "A Spatial Channel Model for Multiple-Antenna Systems." IEEE 2004, pp. 3665-3668.

PV-1000Hb 802.11b RF Transceiver Product Specification, 2002, pp. 1-11.

Rudell et al., "Recent Developments in High Integration Multi-Standard CMOS Transceivers for Personal Communication Systems", 1998 International Symposium on Lower Power Electronics, Monterey, California.

Rudell et al., "Second Generation Multi-Standard Monolithic CMOS RF Transceiver", University of California, Berkeley, Jun. 16, 1996.

Vassiliou et al. "A Single-Chip Digitally Calibrated 5.15-5.825-GHz 0.18µm CMOS Transceiver for 802.11a Wireless LAN." IEEE Journal of Solid-State Circuits, vol. 38, No. 12, Dec. 2003, pp. 2221-2231.

Zhang et al. "A Low-Complexity Antenna Diversity Receiver Suitable for TDMA Handset Implementation." IEEE 1997, pp. 1753-1757.

* cited by examiner

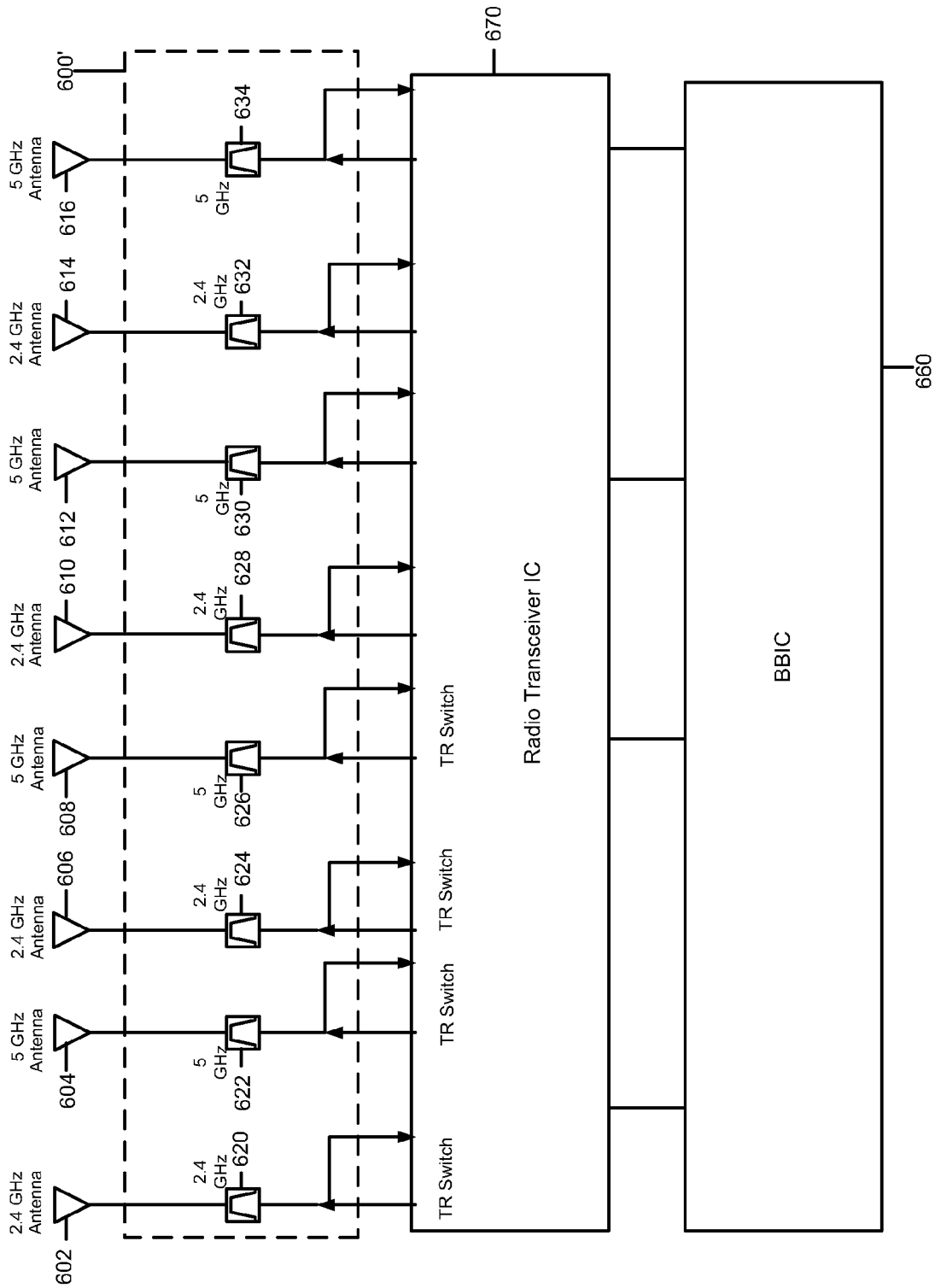

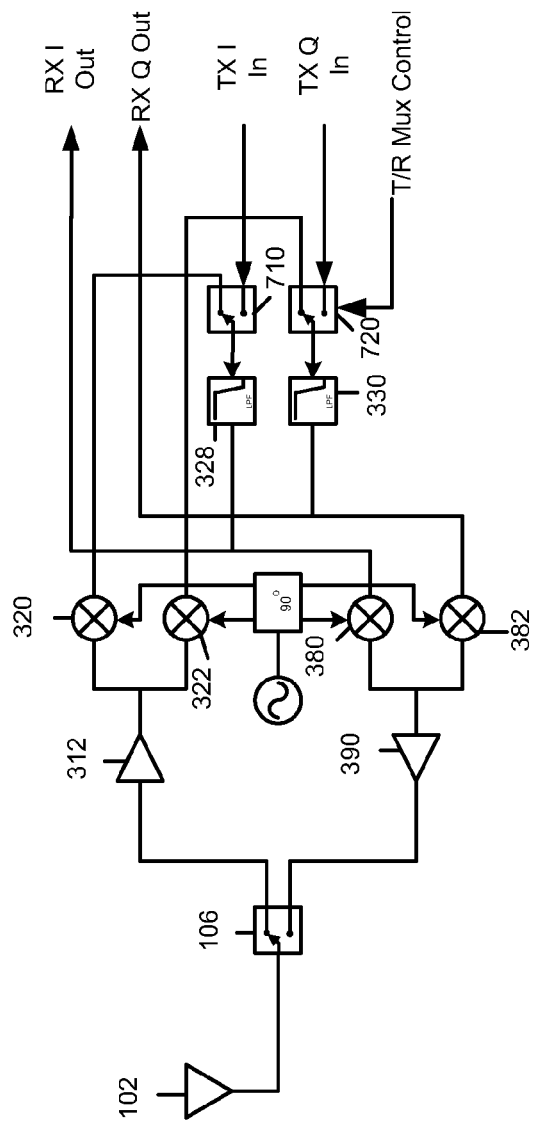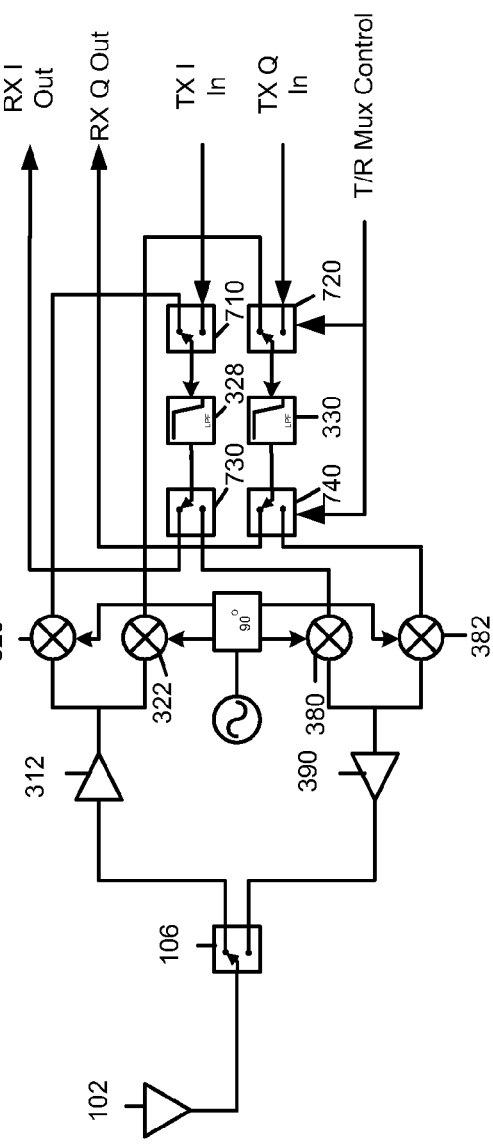

MULTIPLE-INPUT MULTIPLE-OUTPUT RADIO TRANSCEIVER

CROSS REFERENCE TO RELATED APPLICATIONS

This application is a continuation of U.S. patent application Ser. No. 10/707,744 filed Jan. 8, 2004, which is a continuation of U.S. patent application Ser. No. 10/065,388 filed on Oct. 11, 2002, which issued as U.S. Pat. No. 6,728,517 on Apr. 27, 2004, which claims the benefit of U.S. Provisional Patent Applications 60/319,434 filed Jul. 30, 2002, 60/319,360 filed Jun. 27, 2002, 60/319,336 filed Jun. 21, 2002, 60/376,722 filed Apr. 29, 2002, and 60/374,531 filed Apr. 22, 2002, which are incorporated by reference as if fully set forth.

FIELD OF INVENTION

This application is related to wireless communications.

BACKGROUND

A primary goal of wireless communication system design is to use the available spectrum most efficiently. Examples of techniques to increase spectral efficiency include coded modulation techniques such as turbo codes and trellis-coded modulation, and multiple access techniques such as code division multiple access (CDMA).

Yet another way to optimize spectral efficiency that has recently become popular in the academic community is the use of MIMO radio systems. MIMO radio communication techniques have been proposed for use in, for example, 3G mobile telephone systems. However, prior efforts to exploit the benefits of a MIMO system have failed because, among other reasons, a cost-effective MIMO radio could not be developed.

SUMMARY

A MIMO radio transceiver is provided to support processing of multiple signals for simultaneous transmission via corresponding ones of a plurality of antennas and to support receive processing of multiple signals detected by corresponding ones of the plurality of antennas. The MIMO radio transceiver is one that is suitable for a highly integrated and low cost fabrication. In addition, the radio transceiver can perform MIMO transmit and receive operation in a portion of an RF band, up to substantially the entire RF band. The multiple transmit and receive paths are particularly useful to support joint maximal ratio combining techniques, also referred to herein as composite beamforming (CBF).

The radio transceiver provides, on a single semiconductor integrated circuit, a receiver circuit or path for each of a plurality of antennas and a transmit circuit or path for each of the plurality of antennas. Each receive path downconverts the RF signal detected by its associated antenna to a baseband signal, using either a direct-conversion process or a super-heterodyne (multiple conversion) process. Similarly, each transmit circuit upconverts a baseband signal to be transmitted by an assigned antenna, using either a direct up-conversion process or a multiple-stage conversion process.

The multiple receive and transmit paths are integrated onto the same semiconductor integrated circuit. This provides significant cost and space/area savings. One use of this type of radio transceiver is to receive and transmit signals that, at baseband, are processed using the aforementioned CBF techniques (whereby weighted components of a signal are sent via each of a plurality of antennas and received at the other device by one or more antennas) to enhance the link margin with another communication device. In such an application, it is very important that each of the receive processing paths and each of the transmit processing paths be matched in terms of amplitude and phase response. Because the multiple receive and transmit paths are integrated into a single semiconductor die, the processing paths will inherently be better phase and amplitude matched, and any effects resulting from semiconductor integration will track among the processing paths. Moreover, any operational changes due to temperature variations will also better track among the processing paths because they are integrated into the same semiconductor integrated circuit.

Low cost radio transceiver solutions are provided that, for example, do not require intermediate frequency (IF) filters, have power amplifiers integrated on the radio transceiver integrated circuit (IC), use one frequency synthesizer, and integrate various control switches for transmit/receive and band select operations.

The above and other advantages will become more apparent with reference to the following description taken in conjunction with the accompanying drawings.

BRIEF DESCRIPTION OF THE DRAWINGS

A more detailed understanding may be had from the following description, given by way of example in conjunction with the accompanying drawings wherein:

FIG. 10 is a schematic diagram of yet another radio front-end section useful in connection with a single radio transceiver IC that provides 4 transmit and receive paths.

FIGS. 13 and 14 are diagrams showing how filters in the radio transceiver can be shared so as to reduce the area of an integrated circuit.

DETAILED DESCRIPTION

When referred to hereafter, the terminology "wireless transmit/receive unit (WTRU)" includes but is not limited to a user equipment (UE), a mobile station, a fixed or mobile subscriber unit, a pager, a cellular telephone, a personal digital assistant (PDA), a computer, or any other type of user device capable of operating in a wireless environment. When referred to hereafter, the terminology "base station" includes but is not limited to a Node-B, a site controller, an access point (AP), or any other type of interfacing device capable of operating in a wireless environment.

Figure 1:
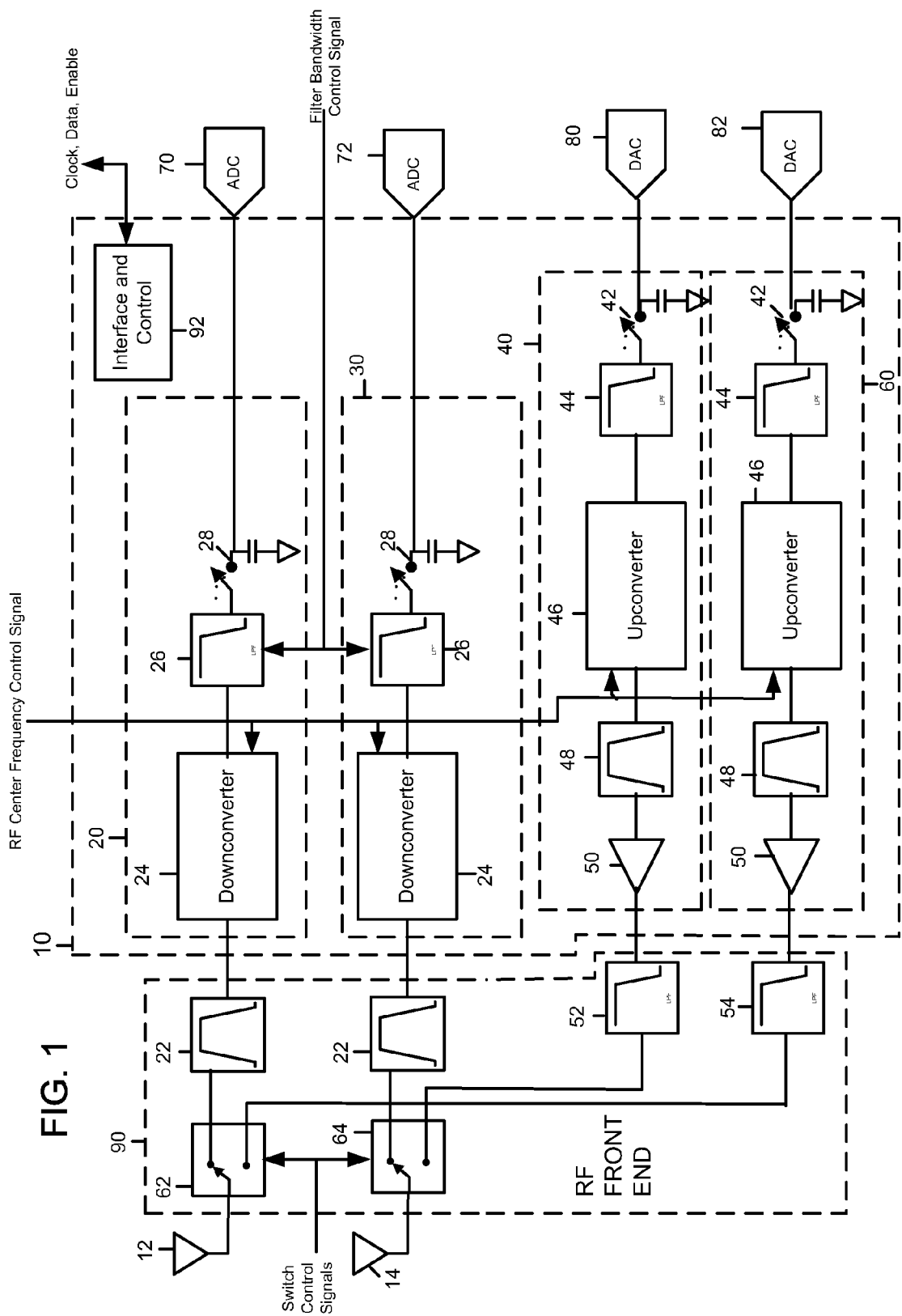
FIG. 1 is a general block diagram of a radio transceiver having multiple processing paths for multiple-input multiple-output (MIMO).

FIG. 1 shows a block diagram of a radio transceiver 10. The radio transceiver 10 is suitable for processing radio frequency signals detected by at least two antennas. The foregoing description is directed to an embodiment with two antennas 12 and 14, and an associated transmit and receive path for each, but this same architecture can be generalized to support in general N processing paths for N-antennas. This radio transceiver architecture is useful to support the aforementioned CBF techniques. CBF systems and methods are described in U.S. patent application Ser. No. 10/164,728, filed Jun. 19, 2002 entitled "System and Method for Antenna Diversity Scheme Using Joint Maximal Ratio Combining;" U.S. patent application Ser. No. 10/174,689, filed Jun. 19, 2002, entitled "System and Method for Antenna Diversity Using Equal Gain Joint Maximal Ratio Combining;" and U.S. patent application Ser. No. 10/064,482, filed Jul. 18, 2002 entitled "System and Method for Joint Maximal Ratio Combining Using Time-Domain Signal Processing." These co-pending and commonly assigned patent applications all relate to optimizing the received SNR at one communication based on the transmit vector used at the other communication device.

One advantage of the technology described in the aforementioned patent application entitled "System and Method for Antenna Diversity Using Equal Gain Joint Maximal Ratio Combining" is that the output power required from each antenna path is reduced. Therefore, the size of the power amplifiers can be reduced, which reduces the overall semiconductor chip area of the IC, and makes it easier to isolate other RF circuitry on the IC from the power amplifiers.

The radio transceiver 10 comprises a receiver and a transmitter. The receiver comprises receiver circuits 20 and 30. There is a receiver circuit or section 20 for antenna 12 and a receive circuit or section 30 for antenna 14. Similarly, the transmitter comprises a transmit circuit 40 for antenna 12 and a transmit circuit 60 for antenna 14. Each receiver circuit 20 and 30 includes a downconverter 24, a variable lowpass filter 26 and a sample-and-hold circuit 28. Each transmit circuit 40 and 60 includes a sample-and-hold circuit 42, a low pass filter 44, an upconverter 46, a bandpass filter 48 and a power amplifier 50. The downconverters 24 may involve circuits to perform single-stage (direct) conversion to baseband or two-stage conversion to an intermediate frequency, then to baseband. Likewise, the upconverters 46 may upconvert directly to RF or to an intermediate frequency, then to RF. More specific embodiments are described hereinafter in conjunction with FIGS. 2-4. The lowpass filters 44 may be variable filters to accommodate a narrowband transmit mode of operation or one of several wideband transmit modes of operation.

A front-end section 90 couples the radio transceiver 10 to antennas 12 and 14. There are switches 62 and 64 coupled to antennas 12 and 14, respectively. Switch 62 selects whether the output of the transmit circuit 60 or the input to the receiver circuit 20 is coupled to antenna 12. Switch 64 selects whether the output of the transmit circuit 40 or the input of the receiver path 30 is coupled to antenna 14. There are bandpass filters 22 coupled to one switch terminal of the switches 62 and 64, respectively. In addition, there are lowpass filters 52 and 54 coupled between the output of the power amplifiers 50 in each transmit circuit 40 and 60, and, the other switch terminal of the switches 62 and 64, associated with antennas 12 and 14, respectively.

The outputs of the sample-and-hold circuits 28 of receiver circuits 20 and 30 are coupled to analog-to-digital converters (ADCs) 70 and 72, respectively. The inputs to the sample-and-hold circuits 42 in the transmit circuits 40 and 60 are coupled to digital-to-analog converters (DACs) 80 and 82, respectively. The DACs 80 and 82 may receive as input first and second digital baseband transmit signals representing complex-weighted transmit signal components of a single baseband signal to be transmitted simultaneously from antennas 12 and 14. The first and second transmitter circuits 40 and 60 process the first and second analog baseband signals for transmission substantially simultaneously. Likewise, antennas 12 and 14 may detect first and second receive signals, respectively, which are components of a single signal that was transmitted to transceiver 10. The first receiver circuit 20 and the second receiver circuit 30 process the first and second receive signals substantially simultaneously to allow for a weighted combining of the resulting digital baseband receive signals.

An interface and control block 92 is provided that interfaces the radio transceiver 10 with other components, such as a baseband processing section. For example, the interface and control block 92 receives a filter bandwidth control signal, a center frequency control signal, and switch control signals, all of which are used to control operation of certain components in the radio transceiver. Alternatively, the aforementioned signals may be sourced for a control processor or baseband section and coupled directly to pins that are tied to the appropriate components of the transceiver 10.

The center frequency control signal controls the center frequency of the local oscillator signals used by the downconverters 24 in each receiver circuit 20 and 30 and of the upconverters 46 in each transmit circuit 40 and 60. In addition, the filter bandwidth control signal controls the cut-off frequency of the variable lowpass filters 26. The switch control signals control the position of the switches 62 and 64 depending on whether the transceiver 100 is receiving or transmitting.

One distinctive function of the radio transceiver 10 is to simultaneously receive and process signals detected by each antenna 12 and 14, in order to output first and second baseband receive signals that are combined appropriately using the aforementioned CBF techniques (in a baseband processor) to obtain a received signal. Conversely, the radio transceiver 10 simultaneously processes first and second baseband analog transmit signals (representing weighted components of a single transmit signal) and outputs them for transmission via antennas 12 and 14, respectively. The radio transceiver 10 shown in FIG. 1 can be operated in a half-duplex mode or, if desired, a full-duplex mode.

Moreover, the radio transceiver 10 may perform MIMO operation in a variable bandwidth. For example, the radio transceiver 10 may transmit or receive a signal in a single RF channel in a radio frequency band, such as a 20 MHz 802.11 channel of the 2.4 GHz band. However, it may also perform MIMO operation to transmit or receive a signal in a wider bandwidth, such as a higher data rate signal or signals that occupy up to substantially an entire frequency band, such as 80 MHz of the 2.4 GHz band. The filter bandwidth control signal sets the cut-off frequency of the lowpass filters 26 in each receiver circuit 20 and 30 to lowpass filter the desired portion of RF bandwidth. The radio transceiver 10 also has a receive-only non-MIMO operation where the output of either receive path can be taken to sample any part or the entire RF band, by adjusting the lowpass filters 26 accordingly. This latter functionality is useful to obtain a sample of a RF band to perform spectrum analysis of the RF band. As is explained in further detail in connection with FIGS. 13 and 14, the lowpass filters 44 in the transmitter may be eliminated and the variable lowpass filters 28 used for both received signals and transmit signals.

The large dotted box around the receiver circuits 20 and 30 and the transmit circuits 40 and 60 is meant to indicate that all of these components, including the power amplifiers 50, may be implemented on a single semiconductor integrated circuit (IC). Other components may also be implemented on the IC as semiconductor and filter design technology allows. The performance advantages achieved by integrating multiple transmit paths and multiple receive paths on the same semiconductor are described above.

Figure 2:
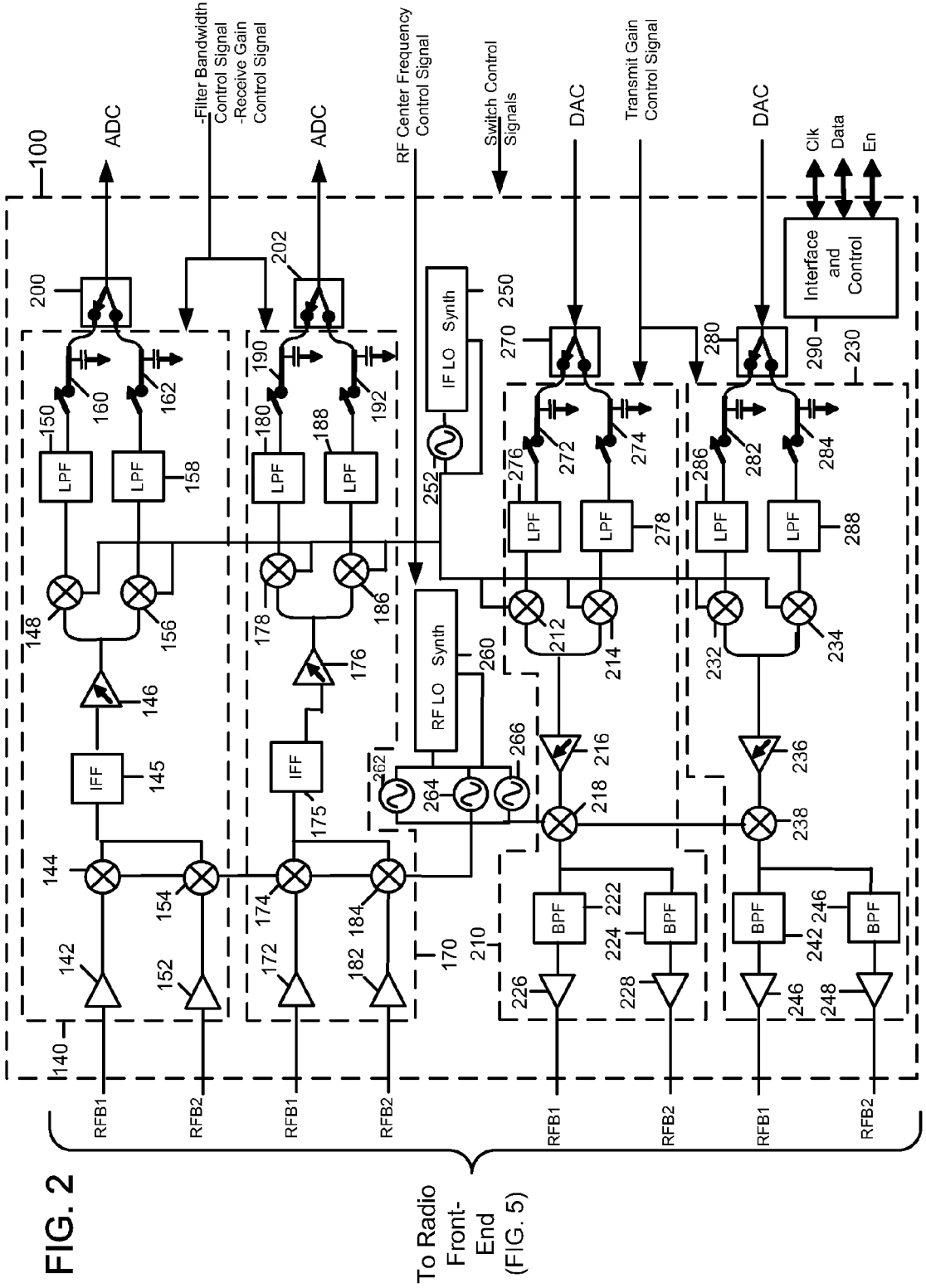
FIG. 2 is a schematic diagram of a MIMO radio transceiver having a super-heterodyne architecture.
Figure 3:
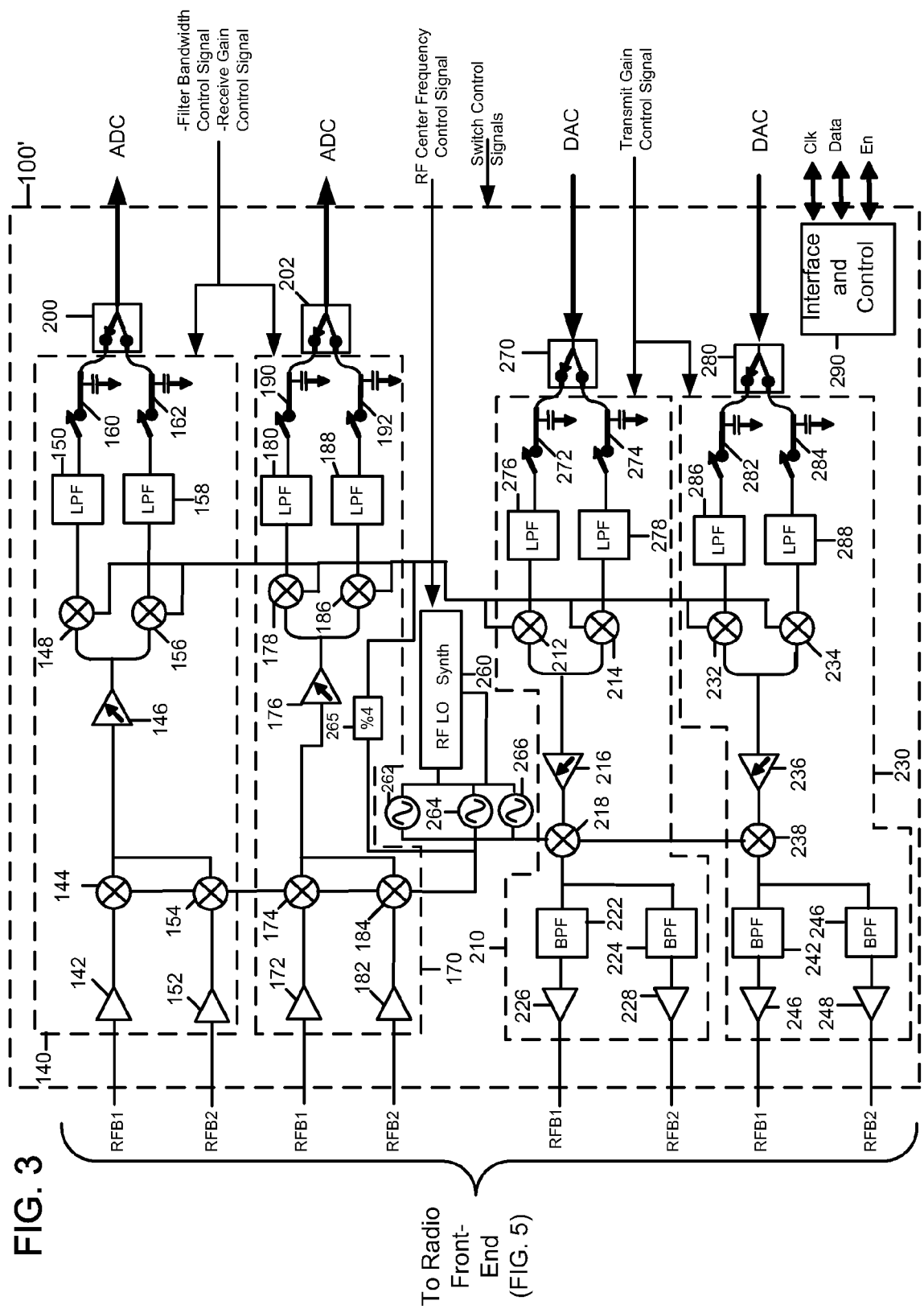
FIG. 3 is a schematic diagram of a MIMO radio transceiver having a variable intermediate frequency architecture.
Figure 4:
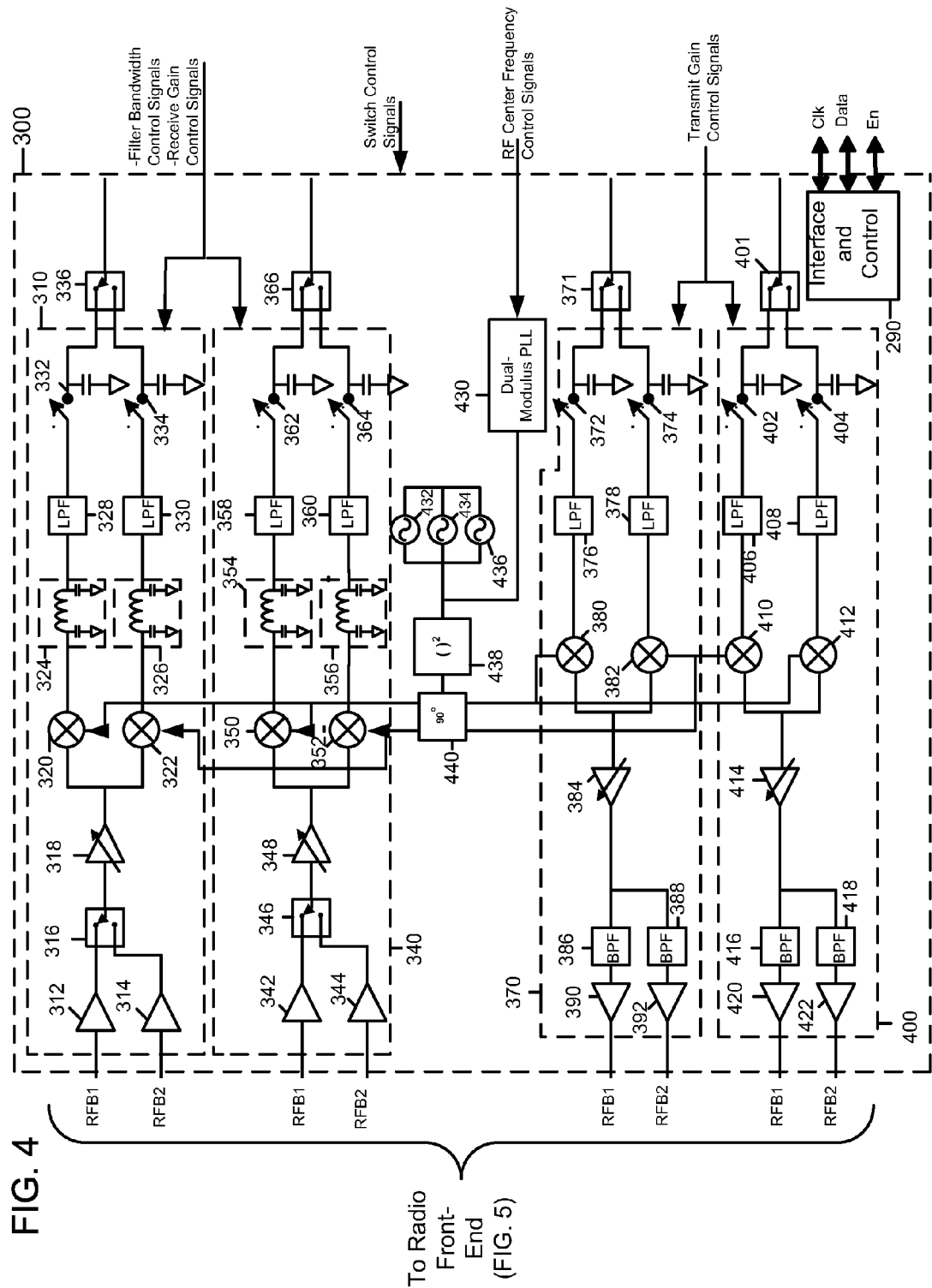
FIG. 4 is a schematic diagram of a MIMO radio transceiver having a direct-conversion architecture.
Figure 5:
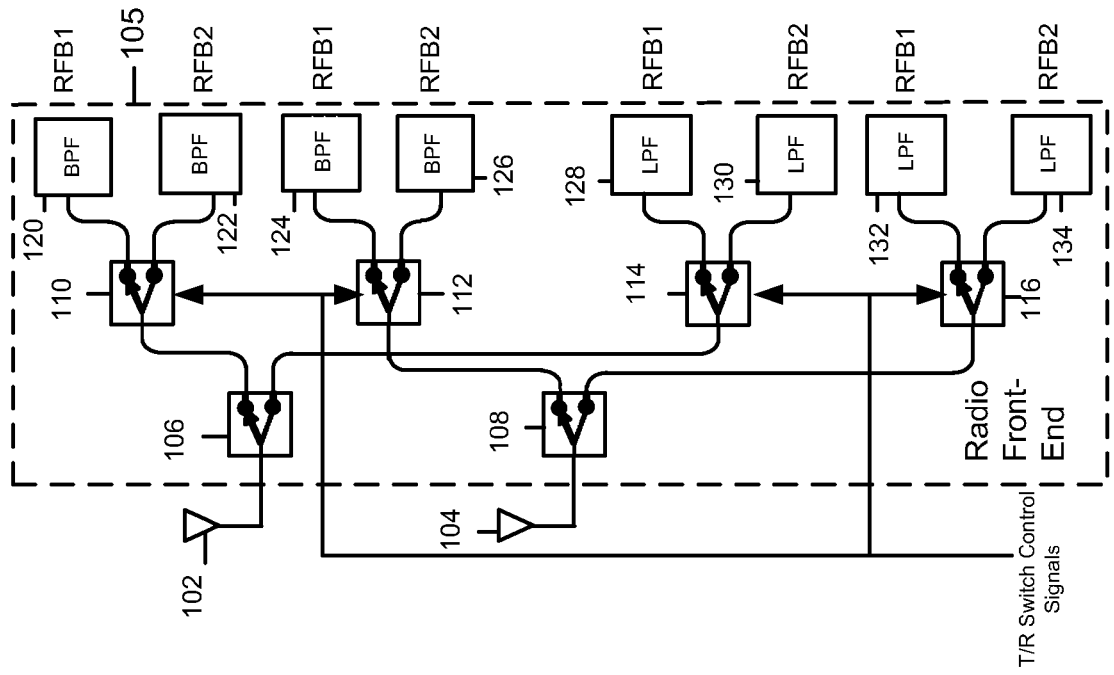
FIG. 5 is a schematic diagram of radio front-end section useful with a MIMO radio transceiver.

FIGS. 2-4 show more specific examples of the MIMO radio transceiver shown in FIG. 1. FIG. 2 shows a dual-band radio transceiver employing a super-heterodyne (two-stage) conversion architecture. FIG. 3 shows a dual-band radio transceiver employing a walking intermediate frequency (IF) conversion architecture using only one frequency synthesizer. FIG. 4 shows a dual-band radio transceiver employing a direct conversion (single-stage) architecture. FIG. 5 illustrates a radio-front end section that can be used with any of the radio transceivers shown in FIGS. 2-4.

With reference to FIG. 2 in conjunction with FIG. 5, radio transceiver 100 will be described. The radio transceiver 100 shown in FIG. 2 is a super-heterodyne receiver that is capable of operating in two different frequency bands, such as, for example, the 2.4 GHz unlicensed band and one of the 5 GHz unlicensed bands.

As shown in FIG. 5, the radio transceiver 100 is designed to be coupled to first and second antennas 102 and 104 via a RF front end section 105 that includes transmit/receive (T/R) switches 106 and 108, which couple to antennas 102 and 104, respectively. Each T/R switch 106 and 108 has an antenna terminal to be coupled to its associated antenna, a receive output terminal and a transmit input terminal and is responsive to T/R switch control signals to select either the receive output terminal or the transmit input terminal, depending on whether the radio transceiver is transmitting or receiving. Also in the RF front end section 105 are band select switches 110, 112, 114 and 116 that select the output of the antenna from switches 106 and 108 depending in which frequency band a signal is being transmitted or received. Band select switches 110 and 112 are receive band select switches, each of which has an input terminal coupled to the receive output terminals of the first and second T/R switches 106 and 108, respectively, and a first output terminal coupled to the BPFs 120 and 124 respectively, and a second output terminal coupled to the BPFs 122 and 126 respectively. Band select switches 114 and 116 are transmit band select switches and each has first and second input terminals and an output terminal. The first input terminals of band select switches 114 and 116 are connected to LPFs 128 and 132, respectively, and the second input terminals of switches 115 and 116 are connected to LPFs 130 and 134, respectively. The output terminals of switches 114 and 116 are coupled to the transmit input terminals of the first and second T/R switches 106 and 108, respectively.

Referring back to FIG. 2, on the receive side of the radio transceiver 100, there is a receiver comprising a receiver path or circuit 140 associated with signals detected by antenna 102 and a receiver path or circuit 170 associated with signals detected by antenna 104. On the transmit side, there is a transmitter comprising a transmit path or circuit 210 associated with antenna 102 and a transmit path or circuit 230 associated with antenna 104. Each of the receiver circuits 140 and 170 has two branches: a first branch to process a signal from a first radio frequency band, and a second branch to process a signal from a second radio frequency band.

More specifically, each branch in the receiver circuits 140 and 170 is coupled to a corresponding one of the bandpass filters 120, 122, 124 or 126 in the RF front end section 105 shown in FIG. 5. In a first branch of the receiver circuit 140, there is a low noise amplifier (LNA) 142 and an RF mixer 144 to downconvert an RF signal from a first radio frequency band (RFB1) to an intermediate frequency (IF). In a second branch of the receiver circuit 140 there is an LNA 152 and an RF mixer 154 that downconverts an RF signal from a second radio frequency band to IF. An IF filter (IFF) 145 is coupled to the mixer 144 and to the mixer 154, and on the output side of the IFF 145 is a variable amplifier 146, quad mixers 148 and 156 and a variable lowpass filters 150 and 158. A sample-and-hold circuit 160 is coupled to variable lowpass filter 150 and a sample-and-hold circuit 162 is coupled to variable lowpass filter 158. As will be described in more detail hereinafter, the first branch of receiver circuit 140 (consisting of LNA 142 and mixer 144) processes a signal from a first RF band (RFB1) detected by antenna 102. The second branch of receiver circuit 140 (consisting of amplifier 152 and mixer 154) processes a signal from a second RF band (RFB2) detected by antenna 102. Only one of the branches of receiver circuit 140 is operating at any given time. As a result, the IFF 145 and the variable power amplifier 146 can be shared by the branches (without the need for an additional switch) assuming the output impedance of the mixers 144 and 154 is high. The quad mixers 148 and 156 generate an in-phase signal (I) and a quadrature-phase (Q) signal of the signal supplied to the input of the variable amplifier 146. Thus, to summarize, the receiver circuit 140 has a first downconverter consisting of an RF mixer (144 or 154, depending on what band branch is being used) that down-mix a first receive signal detected by antenna 102 (FIG. 5) to an intermediate frequency signal, and quad mixers 148 and 156 that further down-mix the intermediate frequency signal to I and Q baseband analog signals.

The receiver circuit 170 has components 172 through 192 that mirror those in the receiver circuit 140, but are used to process a signal from antenna 104 (FIG. 5) in either the first RF band (RFB1) or the second RF band (RFB2). Like receiver circuit 140, receiver circuit 170 has a second downconverter consisting of an RF mixer (174 or 184, depending on what band branch is being used) that down-mixes a second receive signal detected by antenna 104 to a second intermediate frequency signal at the same IF as the first intermediate frequency signal produced in receiver circuit 140, and quad mixers 178 and 186 that further down-mix the second IF signal to I and Q baseband analog signals.

Switches 200 and 202 are coupled to the sample-and-hold circuits in receiver circuits 140 and 170, respectively, to switch between the I and Q outputs associated with the first and second analog baseband receive signals output by receiver circuit 140 and receiver circuit 170, respectively, for processing by an ADC. In addition, switches 270 and 280 serve the additional function on the transmit side to receive as input the output of DACs that supply first and second analog baseband signals to be transmitted.

On the transmit side of the radio transceiver 100 there are two transmit circuits 210 and 230. In transmit circuit 210, there are quad mixers 212 and 214 coupled to receive as input the I and Q data signals, respectively, that up-mix these signals by an intermediate frequency local oscillator signal to an IF. The outputs of the quad mixers 212 and 214 are summed and coupled to the variable amplifier 216, which in turn is coupled to an RF mixer 218. The RF mixer 218 upconverts the intermediate frequency signal to RF, in either RFB1 or RFB2. Bandpass filters 222 and 224 are coupled to the output of the mixer 218. Bandpass filter 222 is associated with RFB1 and bandpass filter 224 is associated with RFB2. There is a power amplifier 226 coupled to the output of the bandpass filter 222 and a power amplifier 228 coupled to the output of bandpass filter 228. The output of power amplifier 226 is coupled to the input of the lowpass filter 128 (FIG. 5) and the output of power amplifier 228 is coupled to the input of the lowpass filter 130 (FIG. 5). To summarize, the first transmit circuit 210 has an upconverter consisting of the quad mixers 212 and 214 that up-mix the baseband I and Q signals representing the first transmit signal, and the RF mixer 218 that further up-mixes the intermediate frequency signal to produce a first RF signal that is to be coupled to the first antenna 102 (FIG. 5). The output of the RF mixer 218 is coupled to bandpass branches consisting of BPF 222 and power amplifier 226 or BPF 224 and power amplifier 228.

The transmit circuit 230 associated with antenna 104 has components 232 through 248 and mirrors transmit circuit 210 to process a second transmit signal component. Similar to the first transmit circuit 210, the second transmit circuit 230 has an upconverter consisting of quad mixers 232 and 234 that up-mix I and Q baseband signals representing the second transmit signal, and an RF mixer 238 that further-up mixes the intermediate frequency signal to produce a second RF signal that is coupled to the second antenna 104 (FIG. 5) for transmission substantially simultaneous with the first RF signal.

The input signals to the transmitter circuits 210 and 230 are supplied from DACs (not shown) to switches 270 and 280 that alternately select between baseband I and Q signals, which are coupled to respective sample-and-hold circuits 272 and 274 (in transmitter circuit 210) and sample-and-hold circuits 282 and 284 in transmitter circuit 230. Sample-and-hold circuits 272 and 274 are in turn coupled to LPFs 276 and 278, respectively, and sample-and-hold circuits 282 and 284 are coupled to LPFs 286 and 288, respectively. LPFs 276 and 278 filter the baseband I and Q signals of the first transmit signal and supply their output to the quad mixers 212 and 214, respectively. Likewise, the LPFs 282 and 288 filter the baseband I and Q signals of the second transmit signal and supply their output to the quad mixers 232 and 234, respectively. The number of LPFs may be reduced if the variable LPFs in the receiver are shared are used for receive processing and transmit processing. One technique for sharing the variable LPFs for transmit and receive operation is shown in FIGS. 13 and 14.

Since radio transceiver 100 is a super-heterodyne device, RF local oscillator signals for the radio frequencies associated with RFB1 and RFB2 and IF local oscillator signals need to be generated. To this end, there is an IF synthesizer (IF LO synth) 250 and a voltage controlled oscillator (VCO) 252 (including a 90° phase component, not shown for simplicity) to generate in-phase and quadrature phase IF local oscillator signals that are coupled to the mixers 148, 156, 178 and 186, and to mixers 212, 214, 232 and 234. There is an RF local oscillator synthesizer (RF LO synth) 260 coupled to VCOs 262, 264 and 266 that supply different RF local oscillator signals to mixers 144, 154, 174 and 184 on the receive side and to mixers 218 and 238 on the transmit side. There are multiple VCOs to supply RF signals for the multiple RF bands. For example, VCO 262 supplies an RF local oscillator signal (for any RF channel in or the center frequency) for the 2.4 GHz unlicensed band, VCO 264 supplies an RF local oscillator signal (for any RF channel in or the center frequency) for the low 5 GHz unlicensed band, and VCO 266 supplies an RF local oscillator signal (for any RF channel in or the center frequency) for the high 5 GHz unlicensed band.

An interface and control block 279 interfaces a clock signal, data signals and an enable signal to/from an external device, such as a baseband processor and/or a control processor. Transceiver control signals sourced from an external device may be coupled to the appropriate transceiver components through the interface control block 290 or coupled to pins that are tied to the appropriate components. The transceiver control signals include, for example, an RF center frequency control signal, a filter bandwidth control signal, a transmit gain adjustment signal, a receive gain adjustment signal and switch control signals. The RF center frequency control signal controls which RF band, and the particular RF channel in that band, for which the RF LO synthesizer 260 and associated VCOs 262, 264 or 267 outputs a local oscillator signal. An example of a frequency synthesizer suitable for use with the radio transceivers described herein is disclosed in commonly assigned U.S. Provisional Application No. 60/319,518, filed Sep. 4, 2002, and entitled "Frequency Synthesizer for Multi-Band Super-Heterodyne Transceiver Applications." The filter bandwidth control signal controls the variable bandwidth lowpass filters 150, 158, 180 and 188 to operate in either a wideband mode (pass the entire frequency band or other substantial portion of it) or a narrowband mode (pass a portion, such as a single RF channel). The transmit gain control signals control the gain of the variable amplifiers 216 and 236 on the transmit side and the receive gain control signals control the gain of the variable amplifiers 146 and 176 on the receive side. The switch control signals control the position of the switches 106, 108, 110, 112, 114, 116, 200 and 202 according to the operating mode of the radio transceiver 100 and the frequency band of operation.

The majority of the components of the radio transceiver 100 are implemented in a semiconductor IC. The large dotted line indicates those components that may be included in the IC; however, additional components may be implemented in the IC.

With reference to FIGS. 2 and 5, operation of the transceiver 100 will be described. For example, RFB1 is the 2.4 GHz unlicensed band and RFB2 is one of the 5 GHz unlicensed bands. It should be understood that the same architecture shown in FIG. 2 can be used for other applications, and that the 2.4/5 GHz dual band application is only an example. For purposes of this example, the IF is 902.5 MHz, and the frequency output by the IF LO synth 250 is 1805 MHz; the RF LO synthesizer outputs an RF local oscillator signal that ranges from 3319.5 MHz to 4277.5 MHz. The variable lowpass filters 150, 158, 180 and 188 are controllable to filter a variety of bandwidths in the RF band, for example to facilitate MIMO receive processing of signals detected by the antennas 102 and 104 in 20 MHz of bandwidth up to 80 MHz or 100 MHz of bandwidth. Similarly, the variable lowpass filters 276, 278, 286 and 288 are controllable to filter a variety of bandwidths in the RF band, for example to facilitate MIMO transmit processing of baseband signals to be transmitted in 20 MHz of bandwidth up to 80 MHz or 100 MHz of bandwidth. Alternatively, and as described hereinafter in conjunction with FIGS. 13 and 14, the variable lowpass filters 150, 158, 180 and 188 may be shared for receive processing and transmit processing. Generally, the radio transceiver 100 is operated in a half-duplex mode during which it does not simultaneously transmit and receive in either RFB1 or RFB2.

The radio transceiver 100 may also be operated in a non-MIMO configuration. For example, the output of only one receive path may be used with the appropriate variable lowpass filter set to sample any portion or all of the desired RF band for obtaining data to analyzing some or all of the spectrum of that RF band.

The T/R switches and band select switches in the RF front-end section 105 (FIG. 5) are controlled according to whether the radio transceiver is transmitting or receiving, and in which RF band it is operating.

For example, when the radio transceiver 100 is receiving in RFB1, switches 106 and 108 are moved to their top positions to select the receive side of the transceiver 100. The RF LO synthesizer 260 is controlled to output RF local oscillator signals that will downconvert a particular (sub-band) from RFB1. Switches 110 and 112 are moved to their top positions to select bandpass filters 120 and 124 (associated with RFB1) and corresponding branches of the receiver circuits 140 and 170. Filter 120 bandpass filters the signal detected by antenna 102 and filter 124 bandpass filters the signal detected by antenna 104. The lowpass filters 150, 158, 180 and 188 are controlled to operate in the desired bandwidth. The two signals detected by antennas 102 and 104 may be spatially diverse signal components of the same transmit signal. The signal from antenna 102 is downconverted to IF by mixer 144, filtered by the IF filter 145, then downconverted to baseband I and Q signals by quad mixers 148 and 156 and filtered by lowpass filters 150 and 158. Each I and Q signal derived from this signal is sample-and-held and alternately selected for output to an ADC by switch 200. The receiver circuit 170 performs a similar operation for the signal detected by antenna 104.

The radio transceiver 100 performs MIMO transmit operation in a similar manner. The LPFs 276, 278, 286 and 288 in the transmitter (or the shared LPFs of the receiver) are controlled to filter the desired bandwidth. In addition, the RF LO synth 260 is controlled to output an RF local oscillator signal according to which frequency band the signals are to be transmitted. Assuming a signal is to be transmitted on a channel in RFB2, the switches 106 and 108 are moved to their bottom positions, selecting the transmit side of the radio transceiver 100. The switches 114 and 116 are moved to their bottom positions, selecting the branch of transmit circuits 210 and 230 associated with RFB2. The analog baseband signal to be transmitted consists of first and second signal components, to be transmitted simultaneously by the respective antennas 102 and 104. The appropriate RF local oscillator signal is output to the mixers 218 and 238. The I and Q signals of a first transmit signal component are upconverted to IF by quad mixers 212 and 214. The variable amplifier 216 adjusts the gain of the resulting IF signal, and the mixer 218 upconverts the IF signal to RF. The filter 224 bandpass filters the RF signal output by the mixer 218 and the power amplifier 228 amplifies the output of the bandpass filter 224. Lowpass filter 130 filters the harmonics of the output of the power amplifier 228, and the resulting output is coupled to the antenna 102 via switches 114 and 106. A similar operation occurs for the I and Q signals of the second transmit signal component. The bandpass filter 246 filters the RF signal and the power amplifier 248 amplifies the filtered signal, which is then coupled to the lowpass filter 134. The resulting filtered signal is coupled to antenna 104 via switches 116 and 108.

FIG. 3 shows a radio transceiver 100' that is similar to radio transceiver 100 except that it employs a variable or walking IF architecture, rather than a super-heterodyne architecture. Particularly, in the receiver circuits of the radio transceiver 100', the received RF signal is downmixed to an intermediate frequency that depends on the RF local oscillator signal, and an IF filter is not needed or is optional. A similar principle applies for the transmit circuits. Therefore, the RF local oscillator signal output of the RF LO synthesizer 260 is coupled to a divide-by-four circuit 265 which in turn supplies an IF local oscillator signal to mixers 148 and 156 in receiver circuit 140, mixers 178 and 186 in receiver circuit 170, mixers 212 and 214 in the transmit circuit 210 and mixers 232 and 234 in the transmit circuit 230. The divide-by-four circuit 265 generates the IF local oscillator signal based on the RF local oscillator signal supplied by the RF LO synthesizer 260. No IF filters are needed and only a single synthesizer (for the RF local oscillator signal) is required. Otherwise, the operation of the radio transceiver 100' is similar to that of radio transceiver 100.

The radio transceivers of FIGS. 2 and 3 have certain advantages that make them suitable for highly integrated and low cost implementations. First, the super-heterodyne architecture of FIG. 2 and the walking IF architecture of FIG. 3 allow for integrating the power amplifiers in the transmitter of the radio transceiver IC. This is because the power amplifier output frequency falls significantly outside the VCO turning range, thereby avoiding injection locking of the VCO. This is not as easily possible in other architectures, such as the direct conversion architecture shown in FIG. 4. Second, the walking IF transceiver of FIG. 3 does not require an IF filter which reduces the bill of materials cost of the radio transceiver. Even the super-heterodyne design of FIG. 2 can be implemented without an IF filter under certain design parameters. The design of FIG. 3 has both the advantage of more easily integrating the power amplifiers as well as not requiring an IF filter. Therefore, the radio transceiver design of FIG. 3 may be desirable where cost, integration and IC size are important.

Referring now to FIG. 4, a direct-conversion radio transceiver architecture 300 is described. Like radio transceiver 100, radio transceiver 300 has multiple receiver circuits 310 and 340 in the receiver and multiple transmit circuits 370 and 400 in the transmitter. The receiver circuits are identical and the transmit circuits are identical. In the receiver circuit 310, there are two amplifiers 312 and 314 both coupled to a switch 316. Amplifier 312 receives a bandpass filtered signal in frequency band RFB1 from a bandpass filter in the RF front end section 105 (FIG. 2), and similarly amplifier 314 receives a bandpass filtered signal in frequency band RFB2. The output of the switch 316 is coupled to a variable amplifier 318 to adjust the gain of the signal supplied to its input. The output of the variable amplifier 318 is coupled to mixers 320 and 322 that down-mix the amplified receive signal by IF local oscillator signals to produce I and Q signals. The output of mixer 320 is coupled to a lowpass filter 324, and the output of mixer 322 is coupled to a lowpass filter 326. The lowpass filters 324 and 326 are, for example, third order lowpass filters that may be located off-chip from the remainder of the transceiver components for better linearity. The outputs of lowpass filters 324 and 326 are coupled to variable lowpass filters 328 and 330, respectively. Variable lowpass filters 328 and 330 can be controlled to vary their cut-off frequency so as to select either a narrowband (e.g., 10 MHz) or a wideband (e.g., 40 MHz). The variable lowpass filters 328 and 330 are coupled to sample-and-hold circuits 332 and 334, respectively. The output of the sample-and-hold circuits 332 and 334 are baseband I and Q signals representing the signal detected by antenna 102. A switch 336 is controlled to alternately select between the baseband I and Q signals for coupling to a single ADC, saving the cost of a second ADC.

Receiver circuit 340 has components 342 through 366 which are the same as the components in receiver circuit 310. Receiver circuits 310 and 340 perform a direct-conversion or zero-intermediate frequency downconversion of the detected RF signals to baseband. To summarize, the first receiver circuit 310 has a first downconverter comprising quad mixers 320 and 322 that down-mix a first receive signal detected by antenna 102 directly to baseband I and Q signals. Likewise, the second receiver circuit 340 has a second downconverter comprising quad mixers 350 and 352 that down-mix a second receive signal detected by antenna 104 directly to baseband I and Q signals.

It will be appreciated by those with ordinary skill in the art that in the receiver circuits 310 and 340, quad mixers 320 and 322, and quad mixers 350 and 352 may be broadband mixers capable of covering both RFB1 and RFB2, or alternatively separate quad mixers may be provided for each RF band.

On the transmit side, transmit circuit 370 comprises first and second sample-and-hold circuits 372 and 374 that receive I and Q data signals for a first transmit signal from switch 371. The outputs of the sample-and-hold circuits 372 and 374 are coupled to the lowpass filters 376 and 378. The outputs of the lowpass filters 376 and 378 are coupled to quad mixers 380 and 382, respectively. The quad mixers 380 and 382 up-mix the filtered I and Q signals output by the lowpass filters 376 and 378 to output RF I and Q signals which are combined and coupled to a variable amplifier 384. The variable amplifier 384 adjusts the gain of the first RF signal and supplies this signal to bandpass filters 386 and 388, associated with RFB1 and RFB2, respectively. The outputs of bandpass filters 386 and 388 are coupled to power amplifiers 394 and 396. Power amplifiers 390 and 392 amplify the RF signals for frequency bands RFB1 and RFB2 which are coupled to the RF front end 105.

Transmit circuit 400 has components 402 through 422 that are the same as those in transmit circuit 370. The input to transmit circuit 400 consists of I and Q signals for a second transmit signal alternately supplied by switch 401. Thus, to summarize, the first transmit circuit 370 comprises an upconverter consisting of quad mixers 380 and 382 that directly up-mix baseband I and Q signals to RF I and Q signals that are combined to form a first RF signal. The second transmit circuit 400 comprises an upconverter consisting of quad mixers 410 and 412 that directly up-mix baseband I and Q signals to RF I and Q signals that are combined to form a second RF signal.

A dual modulus phase-lock loop (PLL) 430, VCOs 432, 434 and 436, a squaring block 438 and a 90° phase shifter 440 may be provided to supply the appropriate in-phase and quadrature RF local oscillator signals to the mixers 320 and 322, respectively, in receiver circuit 310; mixers 350 and 352 in receiver circuit 370; mixers 380 and 382, respectively, in transmit circuit 370; and mixers 410 and 412, respectively, in transmit circuit 400. The dual modulus PLL 430 is a standard component for generating high frequency signals. The squaring block 438 acts as a frequency doubler, reducing pull of the VCO by the power amplifiers. For example, in order to provide RF mixing signals for the 2.4 GHz unlicensed band and the high and low 5 GHz unlicensed band, the VCO 432 produces an RF signal in the range 1200 through 1240 MHz, VCO 434 produces an RF signal in the range 2575 through 2675 MHz, and VCO 436 produces an RF signal in the range 2862 through 2912 MHz.

Like radio transceiver 100, there are control signals that are coupled to the appropriate components to control the operation. Radio transceiver 300 has the same modes of operation as radio transceiver 100. There are filter bandwidth control signals to control the variable lowpass filters 328, 330, 358 and 360 depending on the bandwidth of operation of the transceiver 300. There are receive gain control signals to control the variable amplifiers 318 and 348. There are switch control signals to control the various switches in the radio transceiver 300 and front-end section, depending on whether it is in the receive mode or transmit mode, and depending on which band, RFB1 or RFB2, the transceiver is operating in. There are RF center frequency control signals to control the dual-modulus PLL 410 and VCOs 412-416 depending on which RF band and RF channel in that band the transceiver is operating in. There are transmit gain control signals to control the variable amplifiers 384 and 414 in the transmit circuits.

Figure 6:
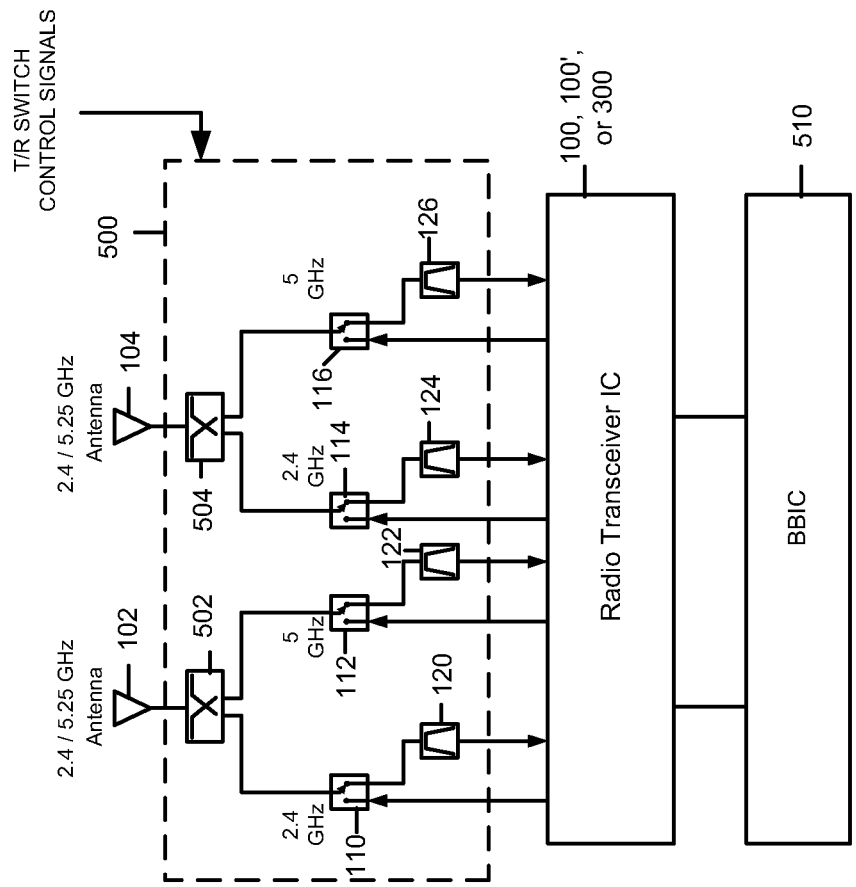

FIGS. 6-10 illustrate alternative front-end sections. In FIG. 6, the front-end 500 section comprises many of the same components as front-end section 105, albeit in a slightly different configuration. The LPFs 128, 130, 132 and 134 may be integrated on the radio transceiver IC or incorporated in the radio front-end 500. Instead of switches 106 and 108, diplexers 502 and 504 are used for band selection from the antennas 102 and 104. As known in the art, a diplexer is a 3-port device that has one common port and two other ports, one for high frequency signals and one for lower frequency signals. Thus, the diplexers 106 and 108 serve as band select switches. In the example of FIG. 6, the two bands that are supported are the 2.4 GHz band and the 5.25 GHz band. Switches 110, 112, 114 and 116 are transmit/receive switches that select the appropriate signals depending on whether the radio transceiver is transmitting or receiving. For example, when the radio transceiver is transmitting a signal in the 2.4 GHz band through antennas 102 and 104, the diplexer 502 receives the first 2.4 GHz transmit signal from switch 110 and couples it to the antenna 102, and the diplexer 504 receives the second 2.4 GHz transmit signal from switch 114 and couples it to antenna 104. All the other switch positions are essentially irrelevant. Likewise, when receiving a signal in the 5.25 GHz band, diplexer 502 couples the first 5.25 GHz receive signal from antenna 102 to switch 112 and diplexer 504 couples the second 5.25 GHz receive signal from antenna 104 to switch 116. Switch 112 selects the output of the diplexer 502 and switch 116 selects the output of the diplexer 504.

Figure 7:
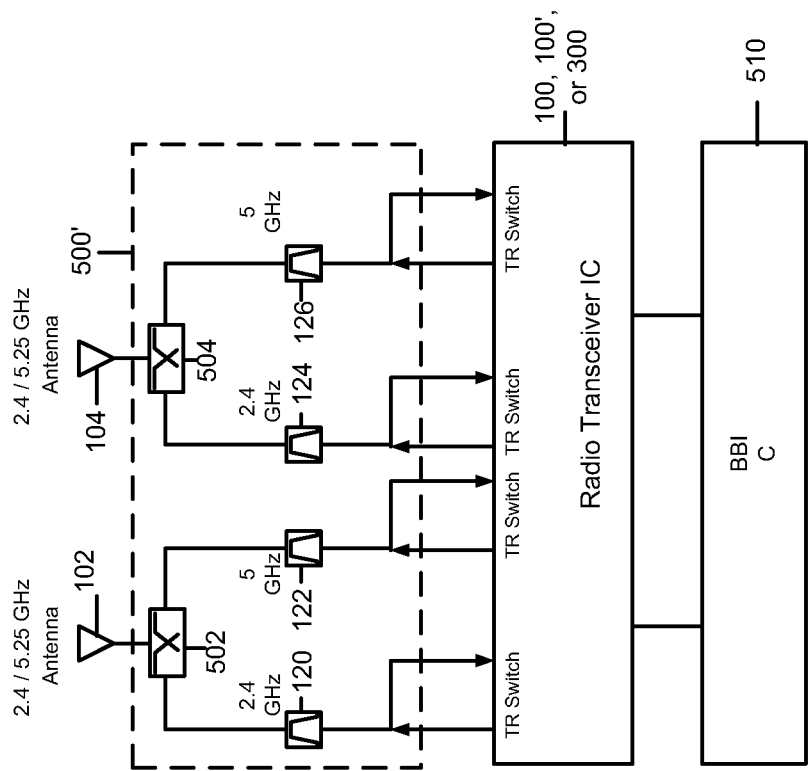
FIGS. 6-8 are schematic diagrams showing alternative radio front-end sections used with a MIMO radio transceiver.

As is known in the art, the radio transceiver is coupled to a baseband processor that may be a separate integrated circuit as shown by the baseband integrated circuit (BBIC) 510 in FIGS. 6 and 7.

Figure 8:
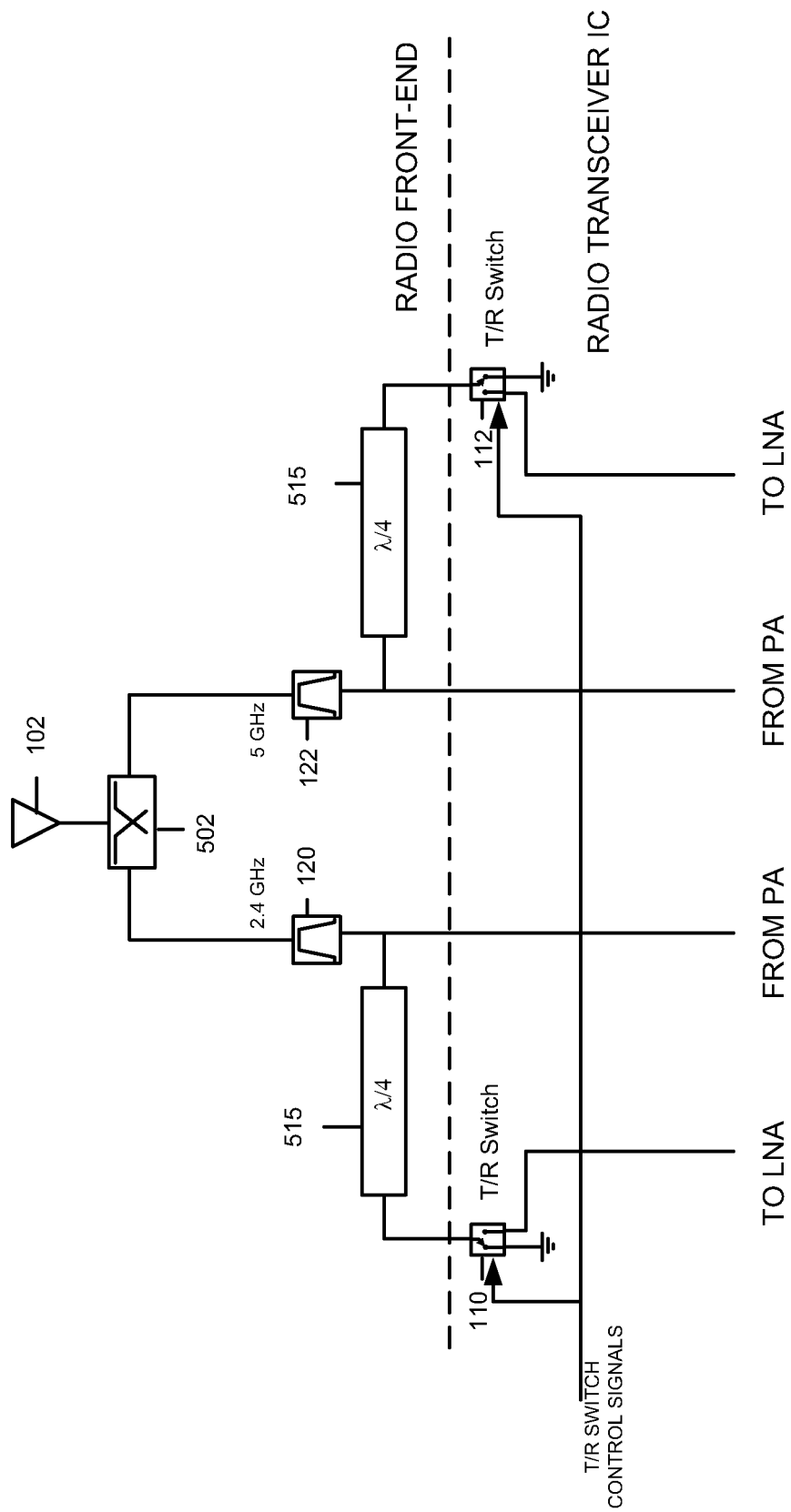

FIG. 7 illustrates a front-end section 500' that is similar to front-end section 500 except that the transmit/receive switches are effectively integrated on the radio transceiver IC. Many techniques are known to integrate switches similar to the transmit/receive switches on the radio transceiver IC. When the transmit/receive switches are integrated on the radio transceiver IC, for each antenna, a quarter-wave element 515 is provided in the radio front-end 500' at each band branch off of the diplexer for each antenna. FIG. 8 shows this configuration for one antenna 102 only as an example, but it is repeated for each antenna. When a signal is being transmitted, the transmit/receive switch is switched to the terminal that is connected to ground so that the signal output by the corresponding power amplifier (PA) of the transmitter is selected and coupled to the diplexer, and when a signal is received, it is switched to the other terminal so that the receive signal passes through the quarter-wave element 525, the transmit/receive switch and passes to the LNA in the receiver. The quarter-wave element 515 may be any quarter-wave transmission line. One example of an implementation of the quarter-wave element 515 is a microstrip structure disposed on a printed circuit board. The quarter-wavelength characteristic of the quarter-wave element 515 creates a phase shift that acts as an impedance transformer, either shorting the connection between the bandpass filter and ground, or creating an open circuit, depending on the position of the switch.

The radio transceiver IC and front-end configurations shown in FIGS. 6 and 7 are useful for network interface cards (NICs) to serve as an 802.11x WLAN station.

Figure 9:
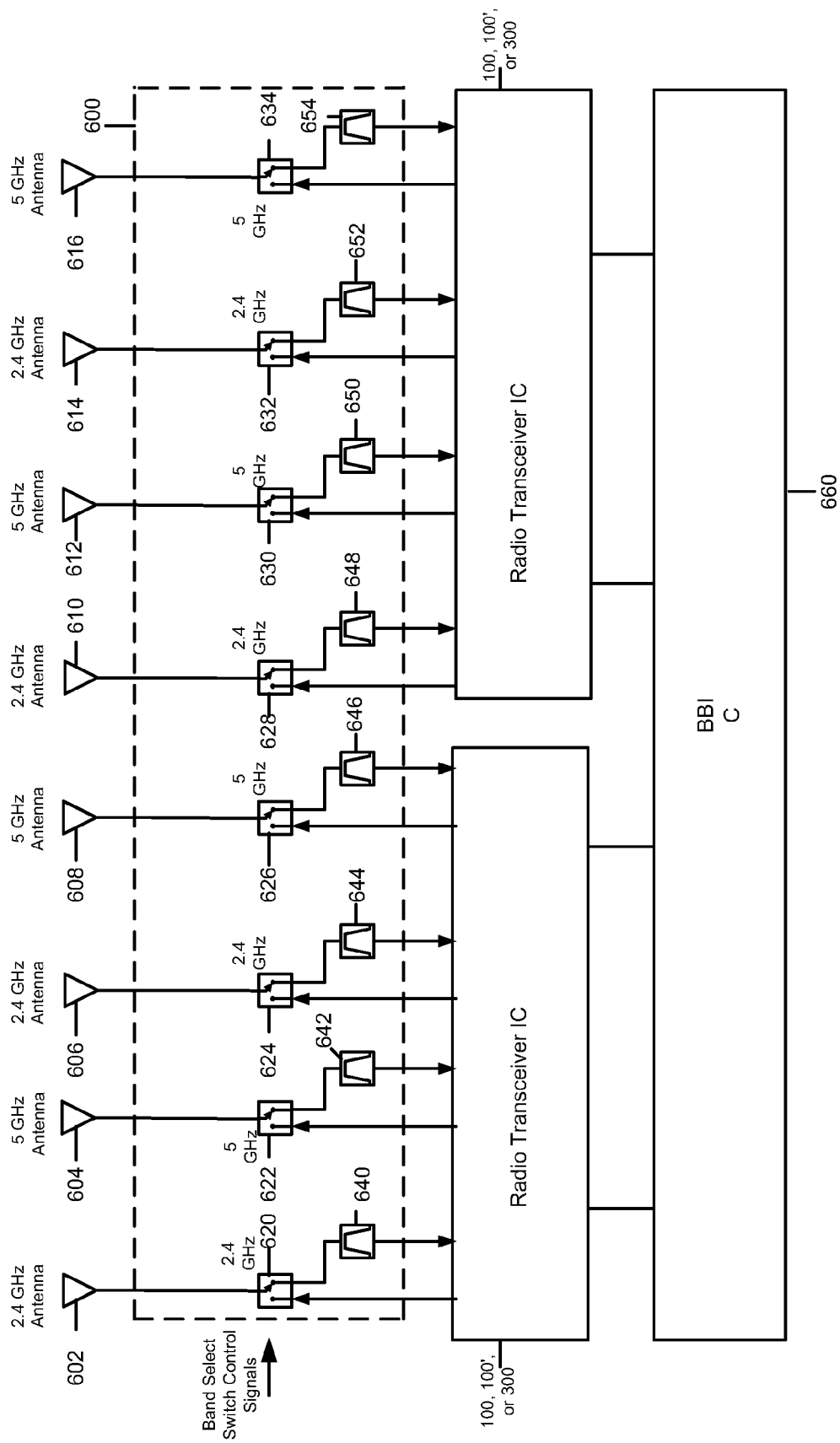
FIG. 9 is a schematic diagram of still another radio-front end useful in connection with two radio transceiver ICs in a single device to provide 4 transmit and receive paths.

FIG. 9 illustrates a front-end section 600 that interfaces with two radio transceiver ICs to provide a 4 path MIMO radio transceiver device. One example of a use for this type of configuration is in an access point (AP) for a WLAN.

Whereas the radio transceiver configurations described up to this point were for 2-path MIMO operation, 4-path MIMO operation provides even greater link margin with other devices when used in connection with the maximal ratio combining schemes referred to above.

The front-end section 600 interfaces two radio transceiver ICs to eight antennas 602 through 616. A BBIC 660 is coupled to the two radio transceiver ICs that operate in tandem to transmit 4 weighted components of a single signal or to receive 4 components of a single received signal. Antennas 602, 606, 610 and 614 are dedicated to one frequency band, such as the 2.4 GHz band and antennas 604, 608, 612 and 616 are dedicated to another frequency band, such as a 5 GHz band. In the front-end section 600, there are transmit/receive switches eight 620 through 634 each associated with one of the antennas 602 through 616 respectively. There are also eight bandpass filters 640 through 654 coupled to respective ones of the transmit/receive switches 620 through 634. The transmit/receive switches 620 through 634 could be integrated on the respective radio transceiver ICs instead of being part of the front-end section 600. Though not specifically shown, the LPFs are also integrated on the radio transceiver ICs. Operation of the front-end section 600 is similar to what has been described above. The transmit/receive switches 620 through 634 are controlled to select the appropriate signals depending on whether the radio transceiver ICs are operating in a transmit mode or a receive mode.

FIG. 10 illustrates a front-end section 600' that is similar to front-end section 600 but excludes the transmit/receive switches. Moreover, the radio transceiver 670 is a single IC that integrates 4-paths (what is otherwise included on two radio transceiver ICs as shown in FIG. 9). The transmit/receive switches are integrated on the radio transceiver IC 670. The operation of the front-end section 600' is similar to that of front-end section 600. FIG. 10 illustrate the ability to scale the number of MIMO paths to 3, 4 or more separate paths.

FIGS. 9 and 10 also illustrate the radio transceivers 100, 100' and 300 deployed in multiple instances to support multiple channel capability in a communication device, such as an AP. For example, as shown in FIG. 9, one radio transceiver, such as an access point, could perform 2-path MIMO communication with devices on a channel while the other radio transceiver would perform 2-path MIMO communication with devices on another channel. Instead of interfacing to one baseband IC, each would interface to a separate baseband IC or a single baseband IC capable of dual channel simultaneous operation.

Figure 12:
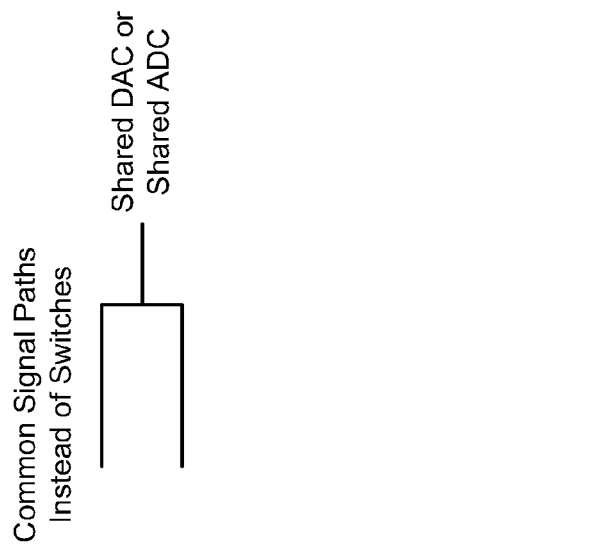
FIGS. 11 and 12 are diagrams showing how digital-to-analog converters and analog-to-digital converters may be shared in connection with a MIMO radio transceiver.
Figure 11:
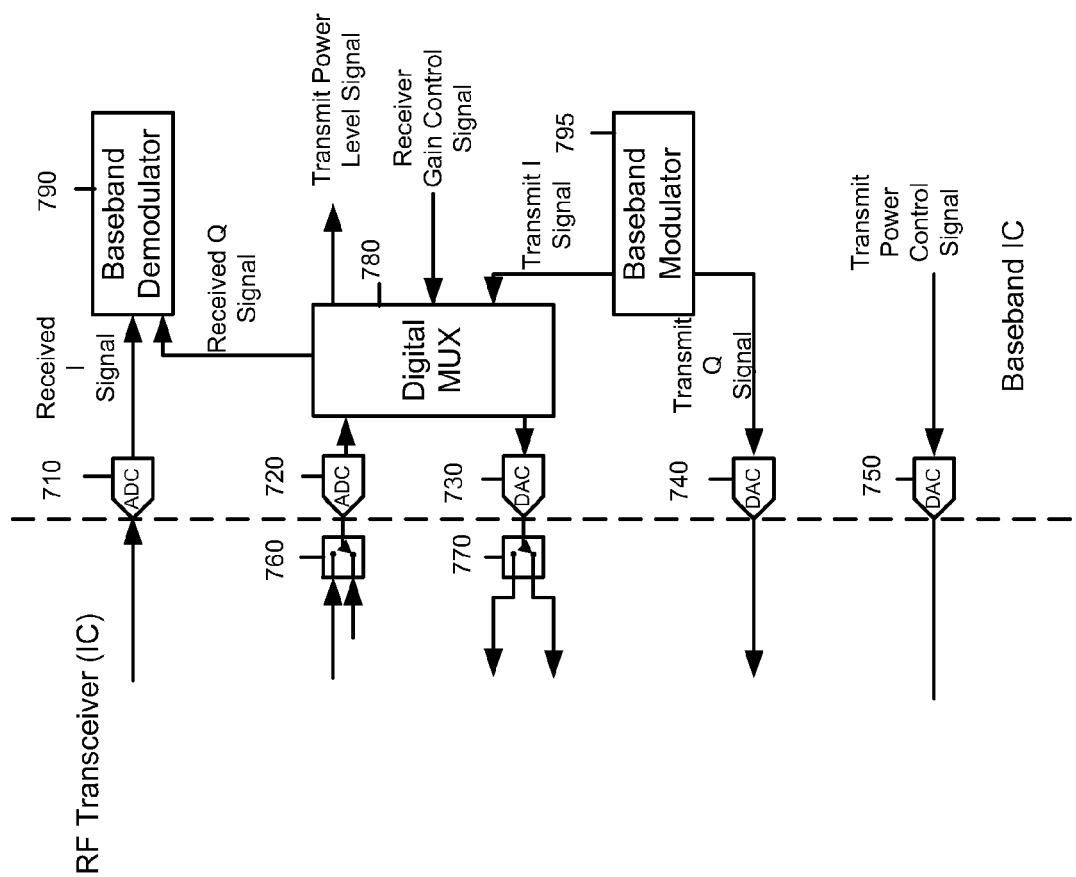

FIGS. 11 and 12 show a configuration whereby the number of DACs and ADCs that are coupled to the radio transceiver can be reduced. Normally, a separate DAC or ADC would be required for every signal that requires processing. However, in a half-duplex radio transceiver, since transmit and receive operations are not concurrent, there is opportunity for sharing DACs and ADCs. For example, FIG. 11 shows a configuration comprising two ADCs 710 and 720 and three DACs 730, 740 and 750. ADC 720 and DAC 730 are shared. Switch 760 selects input to the ADC 720 and switch 770 selects the output of the DAC 730. A digital multiplexer (MUX) 780 is coupled to the ADC 720 to route the output therefrom, and to the DAC 730 to coordinate input thereto. The ADCs, DACs and digital MUX 780 may reside on a separate integrated circuit from the radio transceiver integrated circuit. For example, these components may reside on the baseband integrated circuit where a baseband demodulator 790 and a baseband modulator 795 reside.

The number of ADCs is reduced by using a single ADC 720 to digitize both the received Q signal and the transmit power level signal. Similarly, the number of DACs is reduced by sharing a single DAC 730 to convert both the transmit I signal and the receiver gain control signal. The digital MUX 780 selects the signal (either the transmit I signal or the receiver gain control signal) that is supplied as input to the shared DAC 730. Similarly, the signal that is output by the shared ADC 720 (digital received Q signal or the digital transmit power level signal) is routed to the appropriate destination by the digital MUX 780.

As described above, one way to facilitate sharing of the ADC and the DAC is to provide switches 760 and 770. These switches may reside on the radio transceiver IC. An output terminal of switch 760 is coupled to the shared ADC 720, one input terminal is coupled to the LPF at the output of the local oscillator that generates the received Q signal and the other input terminal is coupled to the output of the power detector that generates the transmit power level signal. Switch 760 is controlled to select one of two positions, depending on whether the ADC is to be used for the received Q signal or the transmit power level signal. Likewise, an input terminal of switch 770 is coupled to the shared DAC 730, one output terminal is coupled to the variable power amplifier in the receiver and the other output terminal is coupled to the LPF that supplies a transmit I signal to the in-phase local mixer in the transmitter. Switch 770 is controlled to select one of two positions, depending on whether the shared DAC is to be used for the receiver gain control signal or the transmit I signal. The configuration shown in FIG. 11 can be repeated for each receive path/transmit path pair in the transceiver.

It should be understood that the switches 760 and 770 are optional. As shown in FIG. 12, they may be replaced with common signal paths if the radio transceiver IC is a half-duplex transceiver, meaning that the receiver and transmitter are not operational at the same time. Therefore, the shared DAC 730, for example, will convert whichever digital signal is supplied to it (the transmit I signal or the receiver gain control signal, depending on whether the transceiver is in receive mode or transmit mode), and the DAC 730 will output the analog version of that signal on both paths. If the transmit I signal is selected for processing by the shared DAC 730, the receiver will be off, so coupling a analog version of the transmit I signal to the variable power amplifier in the receive channel will have no effect, but it also will be coupled to the in-phase local oscillator in the transmitter, which is desired. A similar situation holds true if the switch for the shared ADC 720 is replaced with a common signal path configuration.

A single ADC and a single DAC can be shared among signals from the transmitter and receiver (since in a half-duplex transceiver, the transmitter and receiver are generally not operational at the same time). The signals that are identified above are only examples of the transmitter and receiver signals that may be multiplexed to a single ADC or single DAC.

FIGS. 13 and 14 illustrate configurations that allow for sharing of the LPFs used to filter the baseband receive signals and baseband transmit signals in the radio transceivers of FIGS. 2-4. As an example, a single antenna path of the direct conversion radio transceiver 300 is selected to illustrate the filter sharing technique. Some intermediate components, such as variable amplifiers and sample-and-hold circuits, are not shown for simplicity. LPFs 328 and 330 are shared to both filter the received I and Q signals (RX I and RX Q) associated with an antenna, such as antenna 102, and filter the baseband transmit I and Q signals (TX I and TX Q) to be transmitted. The switches 710 and 720 each have two input terminals and an output terminal coupled to the input of the LPFs 328 and 330, respectively. Coupled to the input terminals of the switch 710 are the receive I signal output by the quad mixer 320 and the baseband transmit I signal. Similarly, coupled to the input terminals of the switch 720 are the receive Q signal output by the quad mixer 322 and the baseband transmit Q signal. A transmit/receive control signal is coupled to the switches 710 and 720 to cause the switches to select either their terminals to which the receive I and Q signals are connected or the terminals to which the transmit I and Q signals are connected. In FIG. 13, it is assumed that the output impedance at each filter is low and each load impedance is high (typical in most analog ICs) so that the output of each filter can be summed. Therefore, only a single multiplexer is needed at the input to the filters. The configuration of FIG. 14 is similar to FIG. 15, except that additional switches 730 and 740 are provided in case the impedances are not as described above.

In sum, a multiple-input multiple-output (MIMO) radio transceiver is provided comprising a receiver and a transmitter. The receiver comprises at least first and second receiver circuits each to process a signal from a corresponding one of first and second antennas. The first receiver circuit comprises a first downconverter coupled to the first antenna to downconvert a first receive signal detected by the first antenna to produce a first baseband signal; and a first lowpass filter coupled to the first downconverter that lowpass filters the first baseband signal. The second receiver circuit comprises a second downconverter coupled to the second antenna to downconvert a second receive signal detected by the second antenna to produce a second baseband signal; and a second lowpass filter coupled to the second downconverter that lowpass filters the second baseband signal. The transmitter comprises at least first and second transmitter circuits each of which processes a signal to be transmitted by a corresponding one of the first and second antennas. The first transmitter circuit comprising a first upconverter that upconverts a first baseband analog signal to generate a first RF frequency signal; a first bandpass filter coupled to the output of the first upconverter that filters the first RF frequency signal; and a first power amplifier coupled to the output of the bandpass filter that amplifies the filtered RF frequency signal to produce a first amplified signal that is coupled to the first antenna for transmission. Similarly, the second transmitter circuit comprises a second upconverter that upconverts a second baseband analog signal to generate a second RF frequency signal; a second bandpass filter coupled to the output of the second upconverter that filters the second RF frequency signal; and a second power amplifier coupled to the output of the second bandpass filter that amplifies the second filtered RF frequency signal to produce a second amplified signal that is coupled to the second antenna for transmission.

Similarly, a multiple-input multiple-output (MIMO) radio transceiver is provided comprising a receiver comprising at least first and second receiver circuits each to process a signal from a corresponding one of first and second antennas, and a transmitter. The first receiver circuit comprises a first downconverter coupled to the first antenna to downconvert a first receive signal detected by the first antenna to produce a first in-phase baseband signal and a first quadrature-phase baseband signal; and first and second lowpass filters coupled to the first downconverter that lowpass filter the first in-phase baseband signal and the first quadrature phase baseband signal, respectively. The second receiver circuit comprises a second downconverter coupled to the second antenna to downconvert a second receive signal detected by the second antenna to produce a second in-phase baseband signal and a second quadrature-phase baseband signal; and third and fourth lowpass filters coupled to the second downconverter that lowpass filter the second in-phase baseband signal and the second quadrature-phase baseband signal. The transmitter comprises at least first and second transmitter circuits each of which processes a signal to be transmitted by a corresponding one of the first and second antennas. The first transmitter circuit comprises a first upconverter that upconverts a first in-phase baseband analog signal and a first quadrature-phase baseband analog signal to generate a first RF frequency signal; a first bandpass filter coupled to the output of the first upconverter that filters the first RF frequency signal; and a first power amplifier coupled to the output of the first bandpass filter that amplifies the first filtered RF frequency signal to produce a first amplified signal that is coupled to the first antenna for transmission. The second transmitter circuit comprises a second upconverter that upconverts a second in-phase baseband analog signal and a second quadrature-phase baseband analog signal to generate a second RF frequency signal; a second bandpass filter coupled to the output of the second upconverter that filters the second RF frequency signal; and a second power amplifier coupled to the output of the second bandpass filter that amplifies the second filtered RF frequency signal to produce a second amplified signal that is coupled to the second antenna for transmission.

While the foregoing description has referred to a MIMO radio transceiver with two antennas, and thus two receiver circuits and two transmitter circuits, it should be understood that the same concepts described herein may be extended in general to a radio transceiver with N transmitter circuits and N transmitter circuits for operation with N antennas.

The above description is intended by way of example only.

The invention claimed is:

1. A radio transceiver comprising:
a first receiver circuit including a first downconverter, the first receiver circuit configured to receive a signal having a first center frequency from a first antenna, and to downconvert the signal from the first antenna to produce a first receive baseband signal;
a second receiver circuit including a second downconverter, the second receiver circuit configured to receive a signal having the first center frequency from a second antenna, the second antenna spatially separate from the first antenna, the second receiver circuit configured to downconvert the signal from the second antenna to produce a second receive baseband signal substantially simultaneously as the first receiver circuit downconverts the signal from the first antenna;
a first transmitter circuit including a first upconverter, the first transmitter circuit configured to receive a first transmit baseband signal and to upconvert the first transmit baseband signal to produce a first radio frequency signal with a second center frequency for transmission over the first antenna; and
a second transmitter circuit including a second upconverter, the second transmitter circuit configured to receive a second transmit baseband signal, the and to upconvert the second transmit baseband signal to produce a second radio frequency signal with the second center frequency for transmission over the second antenna substantially simultaneously as the transmission of the first radio frequency signal over the first antenna, wherein local oscillator signal center frequencies used by the downconverters and the upconverters are controlled by a radio frequency center frequency control signal.

2. The radio transceiver of claim 1 wherein the first receive baseband signal and the second receive baseband signal are weighted and combined.

3. The radio transceiver of claim 1 wherein the first receive baseband signal and the second receive baseband signal are weighted and combined by maximal ratio combining.

4. The radio transceiver of claim 1 wherein the first transmit baseband signal and the second transmit baseband signal are weighted components of a single transmit signal.

5. The radio transceiver of claim 1 wherein a bandwidth of the received signals from the first and second antenna varies and a bandwidth of the first and second radio frequency signal varies.

6. The radio transceiver of claim 5 wherein the bandwidth range is from 20 MHz to 100 MHz.

7. The radio transceiver of claim 1 wherein the received signals of the first antenna are of a first bandwidth, and the received signals of the second antenna are of a second bandwidth, the first bandwidth being different than the second bandwidth.

8. The radio transceiver of claim 7 wherein the first bandwidth is 20 MHZ and the second bandwidth is 80 MHz.

9. The radio transceiver of claim 1 wherein the first and second transmitter circuits have transmit processing paths that are amplitude matched and the first and second receiver circuits have receive processing paths that are amplitude matched.

10. The radio transceiver of claim 1 wherein transmit processing paths of the first and second transmitter circuits are amplitude and phase response matched, and receive processing paths of the first and second receiver circuits are amplitude and phase response matched.

11. The radio transceiver of claim 1 wherein changes in temperature and amplitude response are tracked between receive paths of the first and second receiver circuits and between transmit paths of the first and second transmitter circuits.

12. The radio transceiver of claim 1 wherein each of the first and second receiver circuits has a separate in-phase receiver path and a separate quadrature receiver path.

13. The radio transceiver of claim 1 wherein each of the first and second transmitter circuits has a separate in-phase transmitter path and a separate quadrature phase transmitter path.

14. The radio transceiver of claim 1 wherein the second receiver circuit and the second transmitter circuit are not used when multiple-input multiple-output processing is not required.

15. The radio transceiver of claim 1 further comprising: a voltage controlled oscillator configured to produce a radio frequency local oscillator signal for use by mixers for downconverting the first antenna received signal and the second antenna received signal having the first center frequency.

16. The radio transceiver of claim 1 further comprising: a voltage controlled oscillator configured to produce a radio frequency local oscillator signal for use by mixers for upconverting the first and second transmit baseband signal to the second center frequency.

17. The radio transceiver of claim 1 further comprising: an intermediate frequency synthesizer configured to produce an intermediate frequency oscillator for use by mixers for downconverting the first antenna received signal and the second antenna received signal.

18. The radio transceiver of claim 1 further comprising: an intermediate frequency synthesizer configured to produce an intermediate frequency oscillator for use by mixers for upconverting the first transmit baseband signal and the second transmit baseband signal.

19. The radio transceiver of claim 1 further comprising: an intermediate frequency synthesizer configured to produce an intermediate frequency oscillator for use by mixers for downconverting the first antenna received signal and the second antenna received signal and for use by mixers for upconverting the first transmit baseband signal and the second transmit baseband signal.

20. The radio transceiver of claim 1 further comprising a baseband integrated circuit for baseband processing the first and second receive baseband signals and for producing the first and second transmit baseband signals.

21. The radio transceiver of claim 1 wherein each of the first and second receiver circuits comprises a filter for filtering the downconverted signal.

22. The radio transceiver of claim 21 wherein the filter is a lowpass filter.

23. The radio transceiver of claim 21 wherein the signal from the corresponding one of the first and second antennas is filtered by a bandpass filter prior to processing by the down converter.

24. The radio transceiver of claim 21 wherein the downconverter comprises a radio frequency mixer which mixes the signal of the corresponding one of the first and second antennas with a radio frequency local oscillator to produce a baseband signal.

25. The radio transceiver of claim 21 wherein the downconverter comprises a radio frequency mixer which mixes the signal of the corresponding one of the first and second antennas with a radio frequency local oscillator to produce an intermediate frequency signal and an intermediate frequency mixer which mixes the intermediate frequency signal with an intermediate frequency local oscillator to produce a baseband signal.

26. The radio transceiver of claim 1 wherein each of the first and second transmitter circuits comprises a filter that filters the corresponding one of the first and second transmit baseband signal.

27. The radio transceiver of claim 26 wherein the filter is a lowpass filter.

28. The radio transceiver of claim 1 wherein each of the first and second transmitter circuits comprises a filter coupled to a power amplifier which process a corresponding one of the first and second radio frequency signals.

29. The radio transceiver of claim 28 wherein the filter is a bandpass filter.

30. The radio transceiver of claim 29 wherein the bandpass filter is operatively coupled to the upconverter and the power amplifier is coupled to an output of the bandpass filter.

31. The radio transceiver of claim 1 wherein each of the first and second upconverters comprises a radio frequency mixer which mixes the corresponding one of the first and second transmit baseband signals with a radio frequency local oscillator.

32. The radio transceiver of claim 1 wherein each of the first and second upconverters comprises an intermediate frequency mixer which mixes the corresponding one of the first and second transmit baseband signals with an intermediate frequency local oscillator and a radio frequency mixer which mixes the corresponding one of the first and second transmit baseband signals with a radio frequency local oscillator.

33. The radio transceiver of claim 1 further comprising:
a first switch with inputs coupled to the first and second receiver circuits and a common output configured to output either the first baseband signal or the second baseband signal; and
a second switch with outputs coupled to the first and second transmitter circuits and a common input configured to input a baseband analog signal to either the first transmitter circuit or the second transmitter circuit.

34. The radio transceiver of claim 1, and further comprising a first power amplifier in the first transmitter circuit coupled to the output of the first upconverter that amplifies the first radio frequency signal and a second power amplifier in the second transmitter circuit coupled to the output of the second upconverter that amplifies the second radio frequency signal.

35. The radio transceiver of claim 34, and further comprising a first bandpass filter coupled between the output of the first upconverter and an input to the first power amplifier that filters the first radio frequency signal, and a second bandpass filter coupled between the output of the second upconverter and an input to the second power amplifier that filters the second radio frequency signal.

36. The radio transceiver of claim 1, wherein the first and second downconverters downconvert the first and second receive signals directly to baseband.

37. The radio transceiver of claim 1, wherein each of the first and second downconverters comprises an radio frequency mixer that down-mixes the first and second receive signals, respectively, to an intermediate frequency signal, and a pair of quad mixers that down-mix the intermediate frequency signal to in-phase and quadrature baseband signals.

38. The radio transceiver of claim 1, wherein each of the first and second receiver circuits further comprises a lowpass filter coupled to the output of the first and second downconverters, respectively, wherein each lowpass filter is a variable lowpass filter that is responsive to a bandwidth control signal so as to pass a portion of a radio frequency band or substantially the entire radio frequency band.

39. The radio transceiver of claim 1 further comprising a plurality of switches, each switch coupled to one of the first and second antennas and coupled to one transmitter circuit and one receiver circuit associated with the one antenna.

40. The radio transceiver of claim 1, further comprising:
an interface and control circuit configured to couple a baseband control with the radio transceiver.

41. The radio transceiver of claim 40, wherein the interface and control circuit is configured to receive at least one of a filter bandwidth control signal, a center frequency control signal, and a switch control signal.

42. A multiple-input multiple-output communication device comprising:
a first downconverter configured to receive a first received signal from a first antenna and configured to downconvert the first received signal to produce a first receive baseband signal;
a second downconverter configured to receive a second received signal from a second antenna, the first and second received signals being spatially diverse versions of a transmitted signal, the second downconverter configured to downconvert the second received signal to produce a second receive baseband signal;
a first upconverter configured to upconvert a first transmit baseband signal to produce a first radio frequency signal, the first radio frequency signal for transmission over the first antenna; and
a second upconverter configured to upconvert a second transmit baseband signal to produce a second radio frequency signal, the second radio frequency signal for transmission over the second antenna, the first and second radio frequency signals for transmission as a multiple-input multiple-output waveform over the first and second antennas, wherein local oscillator signal center frequencies used by the downconverters and the upconverters are controlled by a radio frequency center frequency control signal.

* * * * *